United States Patent
Kim et al.

(10) Patent No.: US 11,336,242 B2
(45) Date of Patent: May 17, 2022

(54) SUPPLY MODULATING CIRCUIT INCLUDING SWITCHING CIRCUIT AND WIRELESS COMMUNICATION DEVICE INCLUDING THE SUPPLY MODULATING CIRCUIT

(71) Applicant: SAMSUNG ELECTRONICS CO., LTD., Suwon-si (KR)

(72) Inventors: Dongsu Kim, Hwaseong-si (KR); Junsuk Bang, Hwaseong-si (KR); Jiseon Paek, Suwon-si (KR); Youngho Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 85 days.

(21) Appl. No.: 16/856,159

(22) Filed: Apr. 23, 2020

(65) Prior Publication Data

US 2021/0083635 A1 Mar. 18, 2021

(30) Foreign Application Priority Data

Sep. 18, 2019 (KR) .......................... 10-2019-0114960

(51) Int. Cl.
| | | |
|---|---|---|
| H03F 3/24 | (2006.01) | |
| H03F 3/195 | (2006.01) | |
| H03F 3/21 | (2006.01) | |
| H04B 1/16 | (2006.01) | |
| H04B 1/04 | (2006.01) | |

(52) U.S. Cl.
CPC ............. *H03F 3/245* (2013.01); *H03F 3/195* (2013.01); *H03F 3/211* (2013.01); *H04B 1/04* (2013.01); *H04B 1/1607* (2013.01); *H03F 2200/102* (2013.01); *H03F 2200/324* (2013.01); *H03F 2200/451* (2013.01); *H03F 2200/504* (2013.01); *H03F 2200/507* (2013.01)

(58) Field of Classification Search
CPC ....................................................... H03F 3/245
See application file for complete search history.

(56) References Cited

U.S. PATENT DOCUMENTS

| | | |
|---|---|---|
| 8,509,713 B2 | 8/2013 | Kenington |
| 8,659,355 B2 | 2/2014 | Henshaw et al. |
| 8,786,373 B2 | 7/2014 | Presti et al. |
| 9,461,590 B2 | 10/2016 | Langer |
| 9,525,384 B2 | 12/2016 | Lee et al. |
| 9,535,491 B2 * | 1/2017 | Drogi ................... H04B 1/1607 |
| 9,843,260 B1 | 12/2017 | Paek et al. |
| 10,038,461 B2 | 7/2018 | Briffa et al. |

(Continued)

FOREIGN PATENT DOCUMENTS

KR 10-2017-0104238 A 9/2017

*Primary Examiner* — Patricia T Nguyen
(74) *Attorney, Agent, or Firm* — Sughrue Mion, PLLC

(57) ABSTRACT

A communication circuit, including a first supply modulator configured to provide a first supply voltage; a first power amplifier configured to generate a first output signal by amplifying a first input signal corresponding to a first operation frequency band; a second power amplifier configured to generate a second output signal by amplifying a second input signal corresponding to a second operation frequency band; and a switching circuit configured to selectively provide the first supply voltage from the first supply modulator to the second power amplifier based on a first switching signal according to an operation mode.

19 Claims, 20 Drawing Sheets

(56) References Cited

U.S. PATENT DOCUMENTS

| | | | |
|---|---|---|---|
| 10,193,500 B2 | 1/2019 | Kim et al. | |
| 10,305,429 B2 | 5/2019 | Choo et al. | |
| 2012/0299660 A1* | 11/2012 | Arkiszewski | H03F 3/602 |
| | | | 330/296 |
| 2013/0135043 A1* | 5/2013 | Hietala | H03F 3/72 |
| | | | 330/124 R |
| 2013/0207731 A1* | 8/2013 | Balteanu | H03F 1/56 |
| | | | 330/296 |
| 2015/0171768 A1* | 6/2015 | Perreault | H03F 3/245 |
| | | | 330/251 |
| 2018/0123516 A1* | 5/2018 | Kim | H03F 3/24 |
| 2019/0020315 A1 | 1/2019 | Khesbak et al. | |
| 2020/0336110 A1* | 10/2020 | Drogi | H04B 1/3838 |
| 2020/0350878 A1* | 11/2020 | Drogi | H03F 1/0227 |
| 2021/0242897 A1* | 8/2021 | Arfaei Malekzadeh | H04B 1/40 |

* cited by examiner

SUPPLY MODULATING CIRCUIT INCLUDING SWITCHING CIRCUIT AND WIRELESS COMMUNICATION DEVICE INCLUDING THE SUPPLY MODULATING CIRCUIT

CROSS-REFERENCE TO THE RELATED APPLICATION

This application is based on and claims priority under 35 U.S.C. § 119 to Korean Patent Application No. 10-2019-0114960, filed on Sep. 18, 2019, in the Korean Intellectual Property Office, the disclosure of which is incorporated by reference herein in its entirety.

BACKGROUND

Wireless communication devices such as smartphones, tablets and Internet of Things (IoT) devices, may use WCDMA (3G), LTE, LTE Advanced (4G), and 5G technologies for high-speed communications. As communication technology develops, high peak-to-average power ratio (PAPR) and high bandwidth of a transmit/receive signal may be required. Accordingly, when a power source of a power amplifier of a transmitting end is connected to a battery, the efficiency of the power amplifier may be lowered. To improve the power efficiency of the power amplifier at a high PAPR and a high bandwidth, average power tracking (APT) technology or envelope tracking (ET) technology is used. Chips that support the average power tracking technology and the envelope tracking technology are called supply modulators (SM).

SUMMARY

According to embodiments, a communication circuit includes a first supply modulator configured to provide a first supply voltage; a first power amplifier configured to generate a first output signal by amplifying a first input signal corresponding to a first operation frequency band; a second power amplifier configured to generate a second output signal by amplifying a second input signal corresponding to a second operation frequency band; and a switching circuit configured to selectively provide the first supply voltage from the first supply modulator to the second power amplifier based on a first switching signal according to an operation mode.

According to embodiments, communication circuit includes a plurality of supply modulators providing a plurality of supply voltages, a plurality of power amplifiers configured to generate a plurality of output signals by amplifying a plurality of input signals based on the plurality of supply voltages; and a plurality of switching components configured to provide the plurality of supply voltages to one or more of the plurality of power amplifiers based on operation frequency bands of the plurality of output signals, wherein the plurality of switching components are configured to provide the plurality of supply voltages to power amplifiers that are connected by connecting each of the plurality of supply modulators to a respective one of the plurality of power amplifiers.

According to embodiments, a wireless communication device includes a modem configured to generate a transmission signal; a supply modulating circuit configured to provide one of a first supply voltage or a second supply voltage; and a supply amplifying circuit configured to generate an output signal by amplifying an input signal generated based on the transmission signal using the one of the first supply voltage or the second supply voltage, wherein the supply modulating circuit comprises at least one switching component configured to provide the one of the first supply voltage or the second supply voltage to the supply amplifying circuit based on an operation frequency.

According to embodiments, a communication circuit includes a first supply modulator configured to provide a first supply voltage; a second supply modulator configured to provide a second supply voltage; a first power amplifier configured to generate a first output signal by amplifying a first input signal using the first supply voltage; a second power amplifier configured to generate a second output signal by amplifying a second input signal using the first supply voltage or the second supply voltage; a third power amplifier configured to generate a third output signal by amplifying a third input signal using the second supply voltage; a first switch configured to switch between the first supply modulator and the second power amplifier based on a first switching signal; and a second switch configured to switch between the second supply modulator and the second power amplifier based on a second switching signal.

According to embodiments, supply modulating circuit configured to provide a supply voltage to a supply amplifying circuit includes a first supply modulator configured to provide a first supply voltage; a second supply modulator configured to provide a second supply voltage; a first switch configured to switch between the first supply modulator and the supply amplifying circuit based on a first switching signal; and a second switch configured to switch between the second supply modulator and the supply amplifying circuit based on a second switching signal.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Embodiments relate to a supply modulating circuit and a wireless communication device, for example a supply modulating circuit including a switching circuit and a supply modulator, and a wireless communication device including the supply modulating circuit. In embodiments, a power modulating circuit may provide a supply voltage to a plurality of power amplifiers from a single supply modulator by using a switching circuit, and a wireless communication device may include the supply modulating circuit.

Hereinafter, embodiments will be described in detail with reference to the accompanying drawings. The embodiments described herein are all exemplary without limiting the inventive concept thereto.

Figure 1:
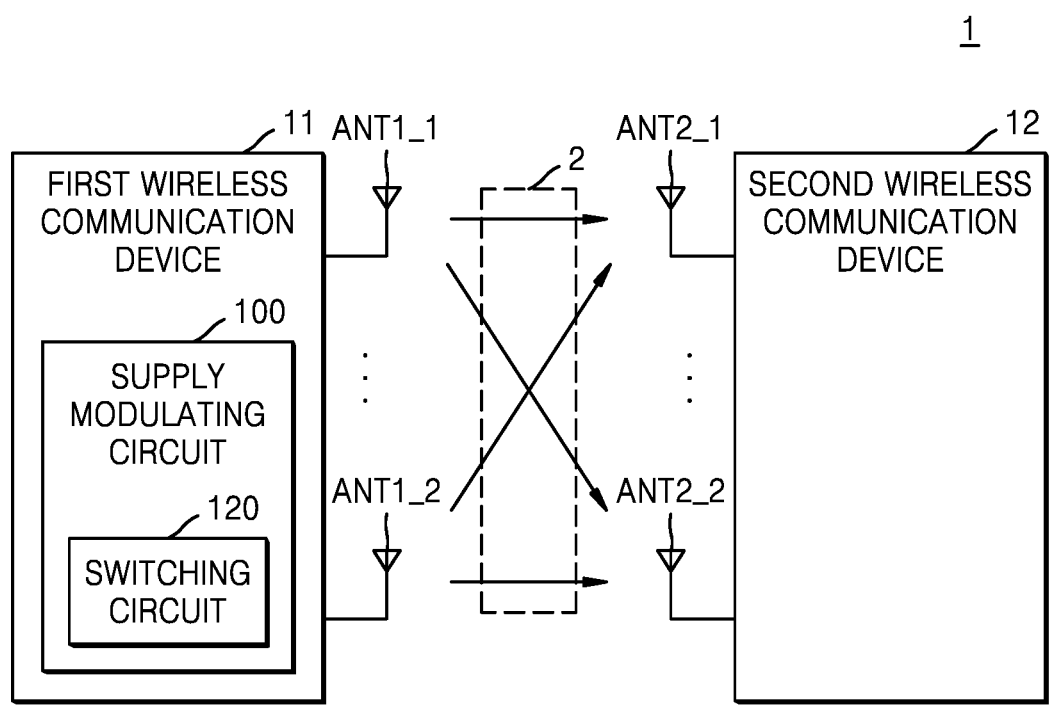
FIG. 1 is a block diagram illustrating a wireless communication system according to an embodiment.

FIG. 1 is a block diagram illustrating an example of a wireless communication system 1 according to an embodiment.

Referring to FIG. 1, the wireless communication system 1 may include a first wireless communication device 11 and a second wireless communication device 12. The wireless communication system 1 may include, an a non-limiting example, a long term evolution (LTE) system, an LTE-advance (LTE-A) system, a code division multiple access (CDMA) system, a global system for mobile communications (GSM) system, a wireless local area network (WLAN) system, a wireless fidelity (WiFi) system, a Bluetooth low energy (BLE) system, a Zigbee system, a near field communication (NFC) system, a magnetic secure transmission (MST) system, a radio frequency (RF) system, or a body area network (BAN) system.

The first wireless communication dev ice 11 and the second wireless communication device 12 may refer to various devices that can communicate with each other to transmit and receive data and/or control information. For example, the first wireless communication device 11 and the second wireless communication device 12 may be configured as either user equipment (UE) or a base station. The UE may be a fixed or mobile wireless communication device and may be referred to as terminal equipment, a mobile station (MS), a mobile terminal (MT), a user terminal (UT), a subscribe station (SS), a wireless device, a handheld device, or the like. A base station (BS) may be generally referred to a fixed station that communicates with the UE and/or other base station, and may be referred to as a Node B, an evolved-Node B (eNB), a base transceiver system (BTS), or the like. In another example, the first and second wireless communication devices 11 and 12 may be configured as any one of a client and an access point (AP). The client may establish a communication link with the AP based on WiFi communication.

The first and second wireless communication devices 11 and 12 may communicate with each other by using a multiple input multiple output (MIMO) method. To this end, the first wireless communication device 11 may include a first antenna Ant1_1 and a second antenna Ant1_2, and the second wireless communication device 12 may include a third antenna Ant2_1 and a fourth antenna Ant2_2.

Each of the first wireless communication device 11 and the second wireless communication device 12 may operate as any one of a transmitting device and a receiving device. When the first wireless communication device 11 operates as a transmitting device, the second wireless communication device 12 may operate as a receiving device. When the second wireless communication device 12 operates as a transmitting device, the first wireless communication device 11 may operate as a receiving device.

A wireless communication network 2 between the first wireless communication device 11 and the second wireless communication device 12 may support communication among multiple users by sharing available network resources. For example, in the wireless communication network, information may be transferred in various methods such as code division multiple access (CDMA), frequency division multiple access (FDMA), time division multiple access (TDMA), orthogonal frequency division multiple access (OFDMA), and single carrier frequency division multiple access (SC-FDMA). In an example, the wireless communication network 2 may provide multi-input multi output (MIMO) communication.

The first wireless communication device 11 may include a supply modulating circuit 100, and the supply modulating circuit 100 may include a switching circuit 120. When the first wireless communication device 11 operates as a transmitter, the supply modulating circuit 100 may generate modulated voltages that vary in level dynamically based on the envelope signal and the interlace signal and supply them to each of the plurality of power amplifiers. A switching circuit 120 may selectively supply the supply voltage generated by the supply modulating circuit 100 to at least some of the plurality of power amplifiers.

According to an embodiment, the switching circuit 120 may selectively supply the supply voltage generated by the supply modulating circuit 100 to at least some of the plurality of power amplifiers according to a required operation frequency, and thus, the number of power amplifiers for covering a dynamic frequency may be reduced, and many combinations of operating frequencies may be supported by a small number of power amplifiers.

Figure 2:
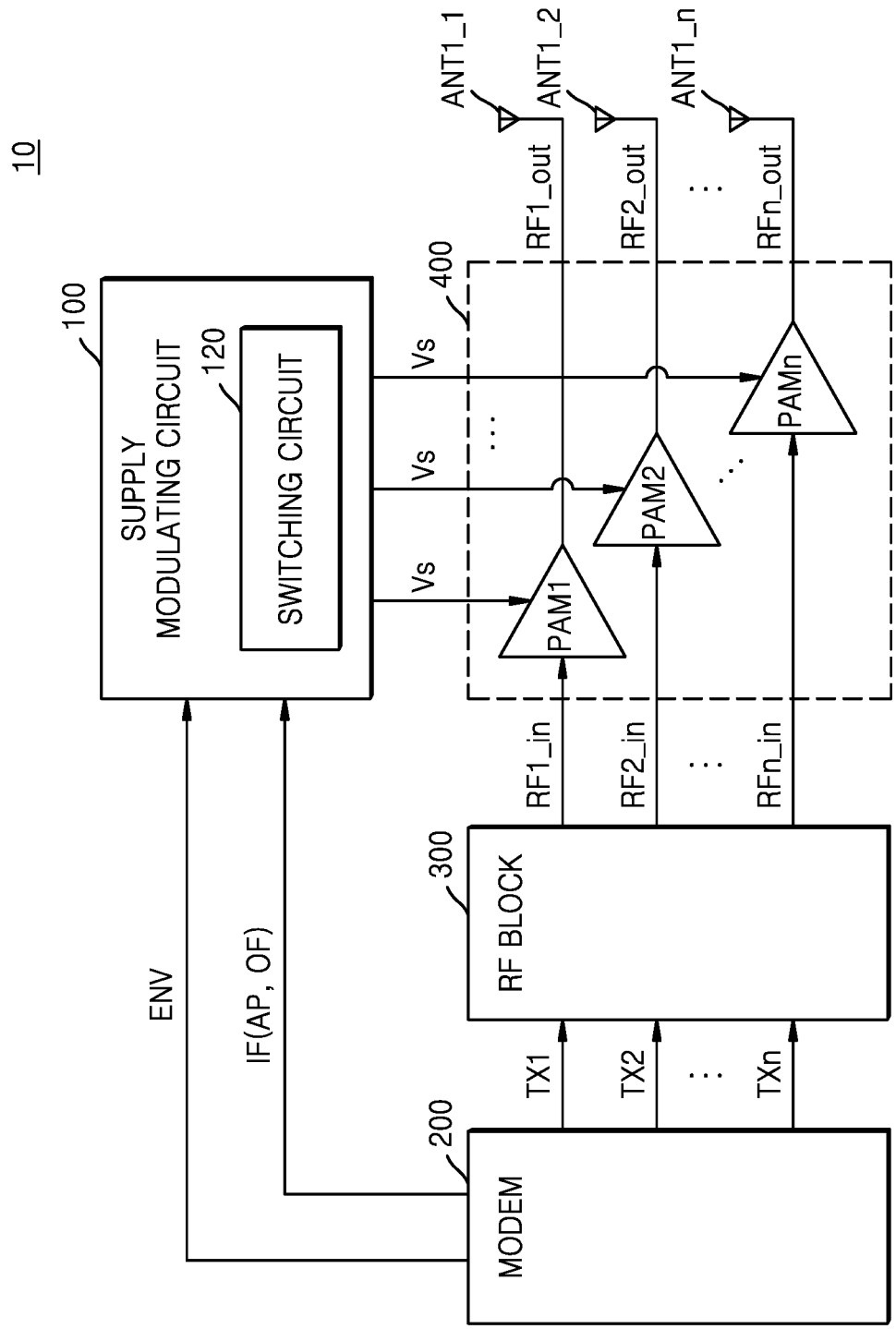
FIG. 2 is a block diagram illustrating a wireless communication device according to an embodiment.

FIG. 2 is a block diagram illustrating an example of a wireless communication device 10 according to an embodiment.

Referring to FIG. 2, the wireless communication device 10 may include a transmitter, and may be mounted in a wireless communication system 1 to transmit data to an external device. The wireless communication device 10 may transmit a transmission signal through a plurality of frequency bands by using carrier aggregation (CA) technology. To this end, the wireless communication device 10 may include the plurality of power amplifiers for power amplifying a plurality of RF input signals respectively corresponding to a plurality of carriers.

The wireless communication device 10 may include a modem 200, a supply modulating circuit, an RF block 300, and a supply amplifying circuit 400. The supply amplifying circuit 400 may include a plurality of power amplifiers PAM1 through PAMn respectively corresponding to carriers.

The modem 200 may process a baseband signal including information to be transmitted according to a corresponding communication method. For example, the modem 200 may process signals to be transmitted according to a communication scheme such as orthogonal frequency division multiplexing (OFDM), orthogonal frequency division multiple access (OFDMA), wideband code multiple access (WCDMA), and high speed packet access+(HSPA +). In addition, the modem 200 may process a signal according to various types of communication methods to which technologies of modulating amplitude and frequency of a transmission signal are applied.

The modem 200 may generate a plurality of transmission signals TX1 through TXn from a plurality of baseband signals including information to be transmitted on each of the plurality of carriers. In addition, the modem 200 may detect an envelope of the plurality of baseband signals to generate an envelope signal ENV and an interface signal IF. In an embodiment, the interface signal IF may include an operation frequency signal OF and an average power (AP) signal, and the envelope signal ENV and the AP signal may correspond to amplitude components of first through $n^{th}$ transmission signals TX1 through TXn. The AP signal may be provided as a reference voltage for each section to the supply modulating circuit. In FIG. 2, one AP signal is illustrated to be output. However, this is only for convenience of description. In an embodiment, a plurality of AP signals may be output as serial data or parallel data. In addition, although one envelope signal ENV is illustrated in FIG. 2, the embodiment is not limited thereto, and a plurality of envelope signals ENV may be generated. In addition, in an embodiment, the first through $n^{th}$ transmission signals TX1 through TXn and the plurality of envelope signals ENV may include differential signals each including a positive signal and a negative signal.

The first through $n^{th}$ transmission signals TX1 through TXn and the envelope signal ENV output from the modem 200 may be analog signals, and the AP signal may be a digital signal. The modem 200 may perform a digital/analog conversion on the plurality of baseband signals and digital envelope signals of the plurality of baseband signals by using a digital to analog converter (DAC), and generate the first through $n^{th}$ transmission signals TX1 through TXn and the envelope signal ENV, which may be analog signals. The AP signal output from the modem 200 may be converted into an analog signal, for example, a reference voltage, by using the DAC provided in the supply modulating circuit 100. In an embodiment, the DAC provided in the modem 200 may operate at a relatively higher speed than the DAC provided in the supply modulating circuit 100. However, the embodiment is not limited thereto, and the modem 200 may convert the AP signal into an analog signal and output the analog signal. The AP signal convened into an analog signal may be provided to the supply modulating circuit 100 as a plurality of reference voltages.

The operation frequency signal OF output from the modem 200 may include information about an operation frequency used for wireless communication with a receiver. In an MIMO system, the wireless communication device 10 may communicate with a receiver by using a plurality of operating frequencies, in which case the operation frequency signal OF may include information about the plurality of operating frequencies. In FIG. 2, an example in which the operation frequency signal OF and the AP signal are included in one interface signal IF is illustrated, but this is only an example, and the operation frequency signal OF and the AP signal may be output to the supply modulating circuit 100 as separate signals via different signal lines.

The RF block 300 may generate first through $n^{th}$ RF input signals RF1_in through RFn_in by up-converting each of the first through $n^{th}$ transmission signals TX1 through TXn based on a corresponding carrier among the plurality of carriers.

The supply amplifying circuit 400 may include first through $n^{th}$ power amplifiers PAM1 through PAMn and may generate first through $n^{th}$ RF output signals RF1_out through RFn_out by amplifying power of the first through $n^{th}$ RF input signals RF1_in through RFn_in, respectively. Each of the first through $n^{th}$ power amplifiers PAM1 through PAMn may amplify the power of each of the received first through $n^{th}$ RF input signals RF1_in through RFn_in based on the applied power voltage. The first though $n^{th}$ RF output signals RF1_out through RFn_out may be transmitted via respectively corresponding antennas ANT1_1 through ANT1_$n$. In FIG. 2, an embodiment in which the supply amplifying circuit 400 includes three power amplifiers is illustrated, but the embodiment is only an example, and the supply amplifying circuit 400 may include more titan three power amplifiers.

The supply modulating circuit 100 may generate modulated voltages in which levels thereof are changed dynamically, based on the envelope signal ENV and the AP signal, and provide the modulated voltages to each of the first through $n^{th}$ power amplifiers PAM1 through PAMn as a supply voltage Vs. When a fixed level power supply voltage is applied to a power amplifier, for example, the first through $n^{th}$ power amplifiers PAM1 through PAMn, an efficiency of the power amplifier may be lowered. For an efficient power management of the power amplifier, the supply modulating circuit 130 may modulate input voltages, for example, a power provided from a battery, based on the envelope signal ENV and/or the AP signal that are generated based on amplitude components of the transmission signals, for example, the first through $n^{th}$ transmission signals TX1 through TXn, and may provide the modulated input voltages to the first through $n^{th}$ power amplifiers PAM1 through PAMn as the supply voltage Vs.

The supply modulating circuit 100 according to the present embodiment may include the supply modulating circuit 120. The supply modulating circuit 100 may include a plurality of supply modulators each providing the supply voltage Vs, and the switching circuit 120 may selectively output the supply voltage Vs provided from the plurality of supply modulators to the first through $n^{th}$ power amplifiers PAM1 through PAMn based on the operation frequency.

Figure 3:
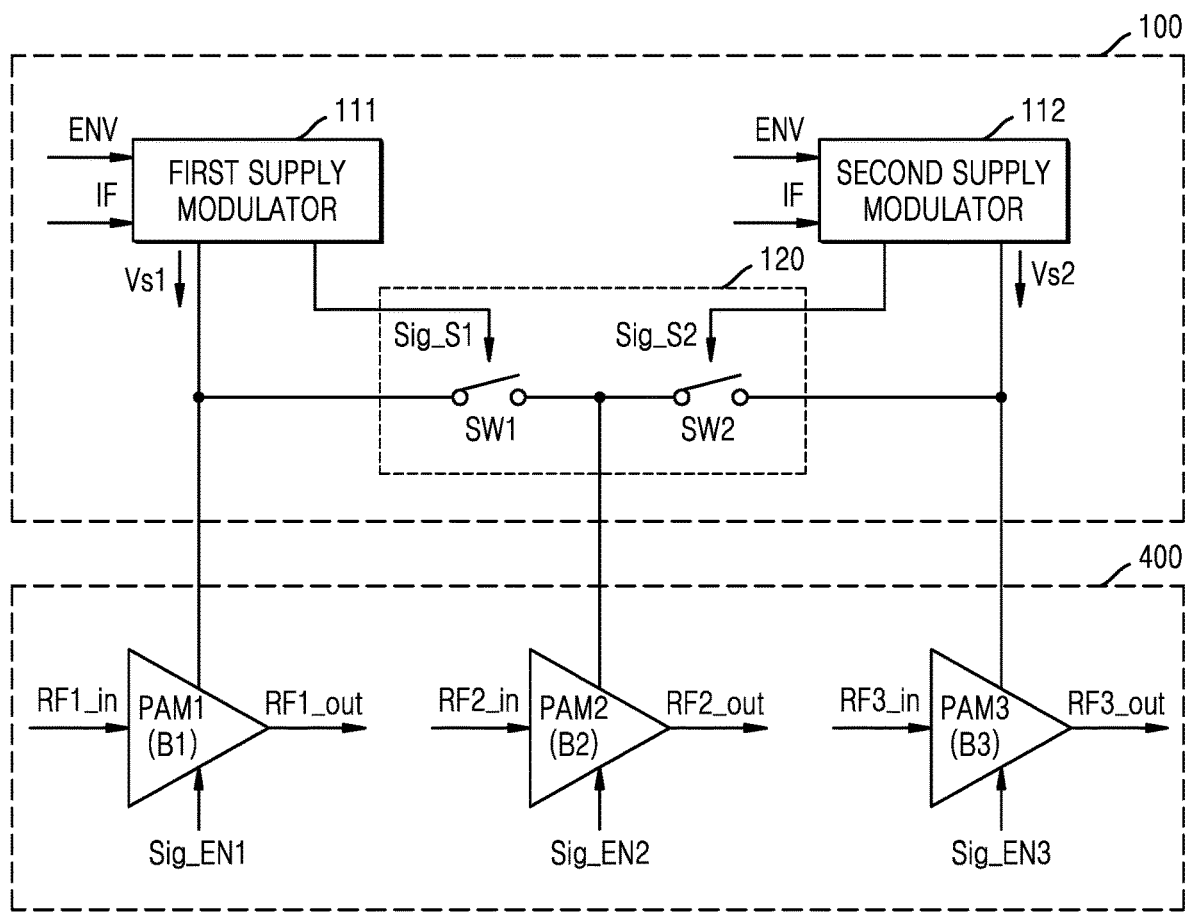
FIG. 3 is a circuit diagram illustrating a communication circuit according to an embodiment.

FIG. 3 is a circuit diagram illustrating an example of a communication circuit 20 according to an embodiment.

Referring to FIG. 3, the communication circuit 20 may represent one or more circuits included in a wireless communication device, for example, wireless communication device 10 of FIG. 2, and may include the supply modulating circuit 100 and the supply amplifying circuit 400. The supply modulating circuit 100 may include a first supply modulator 111, a second supply modulator 112, and the switching circuit 120.

The first supply modulator 111 may receive the envelope signal ENV and the interface signal IF and provide a first supply voltage Vs1 to the supply amplifying circuit 400. In an example, the interface signal IF may include the AP signal and the operation frequency signal OF, and the first supply modulator 111 may determine a voltage level of the first supply voltage Vs1 by using at least one of the envelope signal ENV and the AP signal.

The second supply modulator 112 may receive the envelope signal ENV and the interface signal IF and provide a second supply voltage Vs2 to the supply amplifying circuit 400. In an example, the second supply modulator 112 may determine a voltage level of the second supply voltage Vs2 by using at least one of the envelope signal ENV and the AP signal.

According to an embodiment, the first supply modulator 111 may output a first switching signal Sig_S1 based on the operation frequency signal OF, and the second supply modulator 112 may output a second switching signal Sig_S2 based on the operation frequency signal OF. In an example, the operation frequency signal OF may include information corresponding to frequency bands of the RF output signals, for example, the first through third RF output signals RF1_out through RF3_out, aid the first supply modulator 111 and the second supply modulator 112 may determine the first through third power amplifiers PAM1 through PAM3 that receive the first and second supply voltages Vs1 and Vs2, based on the operation frequency signal OF. Accordingly, the first supply modulator 111 may determine a logic level of the first switching signal Sig_S1, and the second supply modulator 112 may determine a logic level of the second switching signal Sig_S2.

The switching circuit 120 may include a first switch SW1 that operates based on the first switching signal Sig_S1, and a second switch S2 that operates based on the second switching signal Sig_S2. To this end, the first switch SW1 and the second switch SW2 may include switching elements such as a p-type metal oxide semiconductor (PMOS) transistor and an n-type metal oxide semiconductor (NMOS) transistor.

The first switch SW1 may switch between the first supply modulator 111 and the second power amplifier PAM2 based on the first switching signal Sig_S1. In other words, the first switch SW1 may provide to the second power amplifier PAM2 the first supply voltage Vs1 provided from the first supply modulator 111 based on the first switching signal Sig_S1. The second switch SW2 may switch between the second supply modulator 112 and the second power amplifier PAM2 based on the second switching signal Sig_S2. In other words, the second switch SW2 may provide to the second power amplifier PAM2 the second supply voltage Vs2 provided from the second supply modulator 112 based on the second switching signal Sig_S2.

The supply amplifying circuit 400 may include the first power amplifier PAM1, the second power amplifier PAM2, and the third power amplifier PAM3. In an embodiment, the first power amplifier PAM1, the second power amplifier PAM2, and the third power amplifier PAM3 may be configured to amplify RF signals of different operation frequency bands, respectively. In other words, the first power amplifier PAM1 may be configured to amplify the first RF input signal RF1_in of a first operation frequency band B1, the second power amplifier PAM2 may be configured to amplify the second RF input signal RF2_in of a second operation frequency band B2, and the third power amplifier PAM3 may be configured to amplify the third RF input signal RF3_in of a third operation frequency band B3. In an example, the first operation frequency band B1 corresponding to the first power amplifier PAM1 directly connected to the first supply modulator 111 and the third operation frequency band B3 corresponding to the third power amplifier PAM3 directly connected to the second supply modulator 112 may be main frequency bands generally used in a network.

The first power amplifier PAM1 may transmit the first RF output signal RF1_out generated by amplifying the first RF input signal RF1_in via the antenna ANT to the outside, for example, to the second wireless communication device 12 in FIG. 1. The first power amplifier PAM1 may amplify the first RF input signal RF1_in by using the first supply voltage Vs1 received from the first supply modulator 111. The third power amplifier PAM3 may transmit the third RF output signal RF3_out generated by amplifying the third RF input signal RF1_in via the antenna ANT to the outside, for example, to the second wireless communication device 12 in FIG. 1. The third power amplifier PAM3 may amplify the third RF input signal RF3_in by using the second supply voltage Vs2 received from the second supply modulator 112.

The second power amplifier PAM2 may transmit the second RF output signal RF2_out generated by amplifying the second RF input signal RF2_in via the antenna ANT by using the second operation frequency band B2 to the outside, for example, to the second wireless communication device 12 in FIG. 1. The second power amplifier PAM2 may amplify the second RF input signal RF2_in by using the Fust supply voltage Vs1 received from the first supply modulator 111 or the second supply voltage Vs2 received from the second supply modulator 112.

According to an embodiment, a source of a supply voltage applied to the second power amplifier PAM2 may vary based on the operation of the switching circuit 120. In an example, when the first switch SW1 is shorted and the second switch SW2 is open, the second power amplifier PAM2 may receive the first supply voltage Vs1 from the first supply modulator 111, and when the first switch SW1 is opened and the second switch SW2 is shorted, the second power amplifier PAM2 may receive the second supply voltage Vs2 from the second supply modulator 112.

According to an embodiment, the operation of the switching circuit 120 may be determined based on the operation frequency band in which the RF signal is transmitted. In the example of transmitting the RF signal via the first operation frequency band B1 and the third operation frequency band B3, both the first switch SW1 and the second switch SW2 may be opened such that the first supply voltage Vs1 is applied to the first power amplifier PAM1 and the second supply voltage Vs2 is applied to the third power amplifier PAM3. In addition, the second power amplifier PAM2 may be deactivated based on a second enable signal Sig_EN2.

In the example of transmitting the RF signal via the first operation frequency band B1 and the second operation frequency band B2, the first switch SW1 may be opened and the second switch SW2 may be shorted such that the first supply voltage Vs1 is applied to the first power amplifier PAM1 and the second supply voltage Vs2 is applied to the second power amplifier PAM2. In addition, the third power amplifier PAM3 may be deactivated based on a third enable signal Sig_EN3, and the second supply voltage Vs2 may be prevented from being applied to the third power amplifier PAM3. Accordingly, the third power amplifier PAM3 may be prevented from consuming power by using the second supply voltage Vs2.

In an example of transmitting a signal by using the second operation frequency band B2 and the third operation frequency band B3, the first switch SW1 may be shorted and the second switch SW2 may be opened such that the first supply voltage Vs1 is applied to the second power amplifier PAM2 and the second supply voltage Vs2 is applied to the third power amplifier PAM3. In addition, the first power amplifier PAM1 may be deactivated based on the first enable signal Sig_EN1, and the first supply voltage Vs1 may be prevented from being applied to the first power amplifier PAM1. Accordingly, the first power amplifier PAM1 may be prevented from consuming power by using the first supply voltage Vs1.

In an embodiment, the first through third enable signals Sig_EN1 through Sig_EN3 may be output by the supply modulating circuit 100. In another example, the first through third enable signals Sig_EN1 through Sig_EN3 may be output by a modem, for example modem 200 in FIG. 2, or an RF block, for example RF block 300 in FIG. 2).

The communication circuit 20 according to an embodiment may selectively apply a supply voltage to a power amplifier according to an operation frequency band and support a plurality of combinations of operation frequency bands even with a small number of power amplifiers.

In FIG. 3, the switching circuit 120 is illustrated as being independent of the first supply modulator 111 and the second supply modulator 112, but in another example, the switching circuit 120 may include at least one of the first supply modulator 111 and the second supply modulator 112. In an example, the first switch SW1 may be included in the first supply modulator 111, and the second switch SW2 may be included in the second supply modulator 112.

Figure 4:
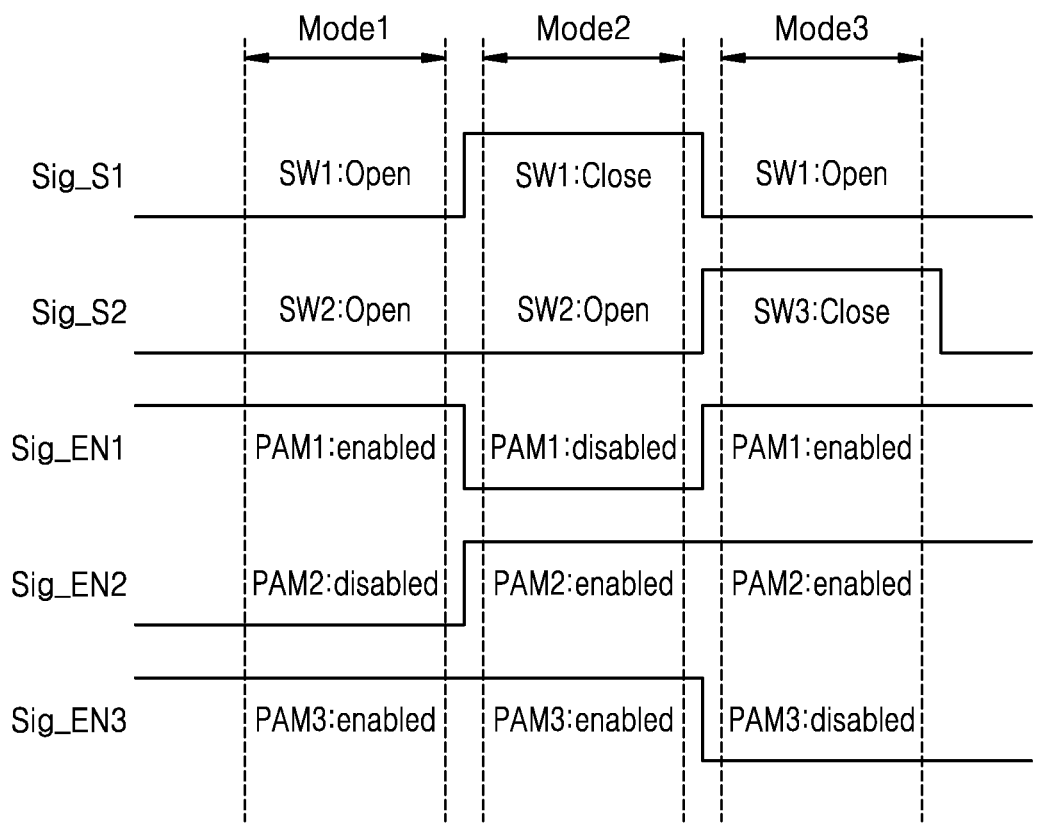
FIG. 4 is a timing diagram illustrating operations of a switching signal and an enable signal, according to an embodiment.
Figure 5A:
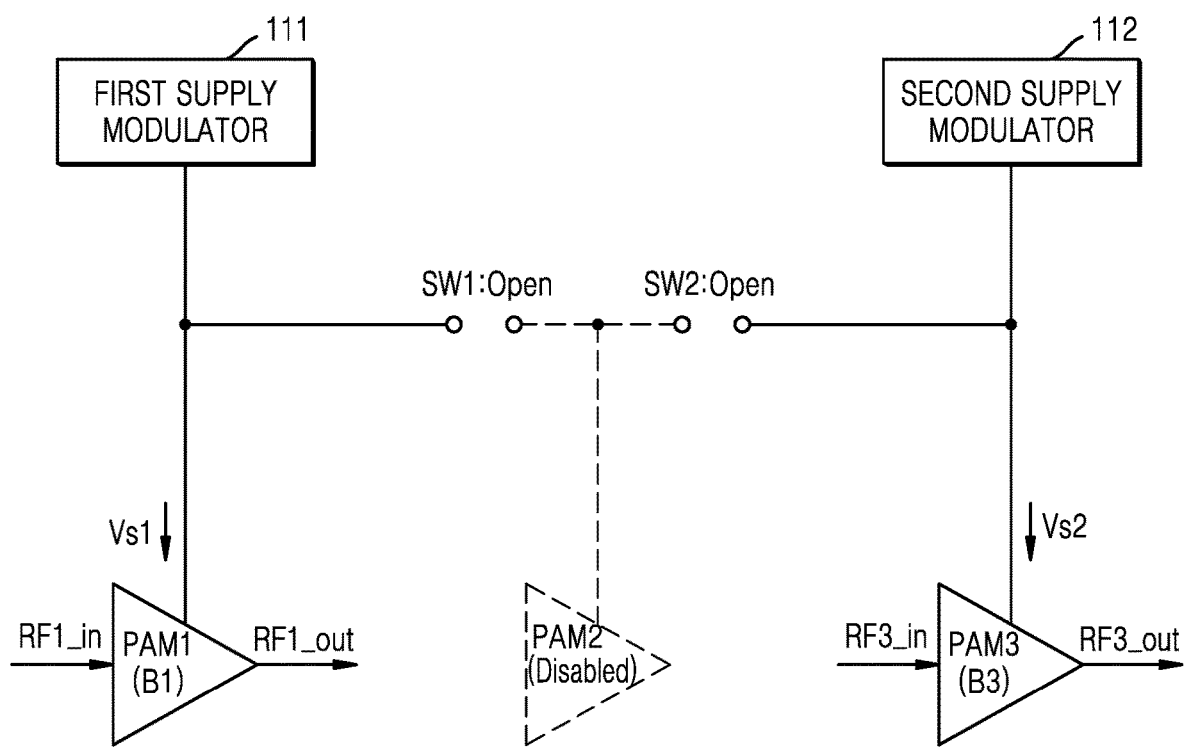
FIGS. 5A through 5C are diagrams illustrating a communication circuit according to an embodiment.
Figure 5B:
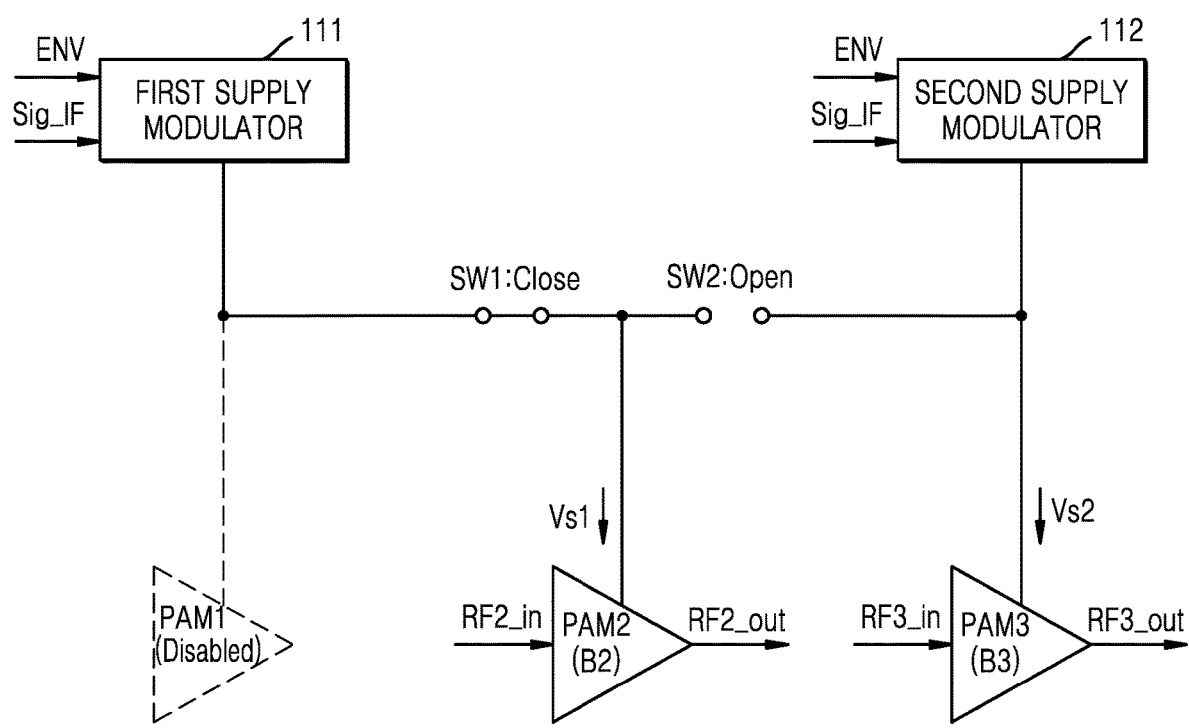
Figure 5C:
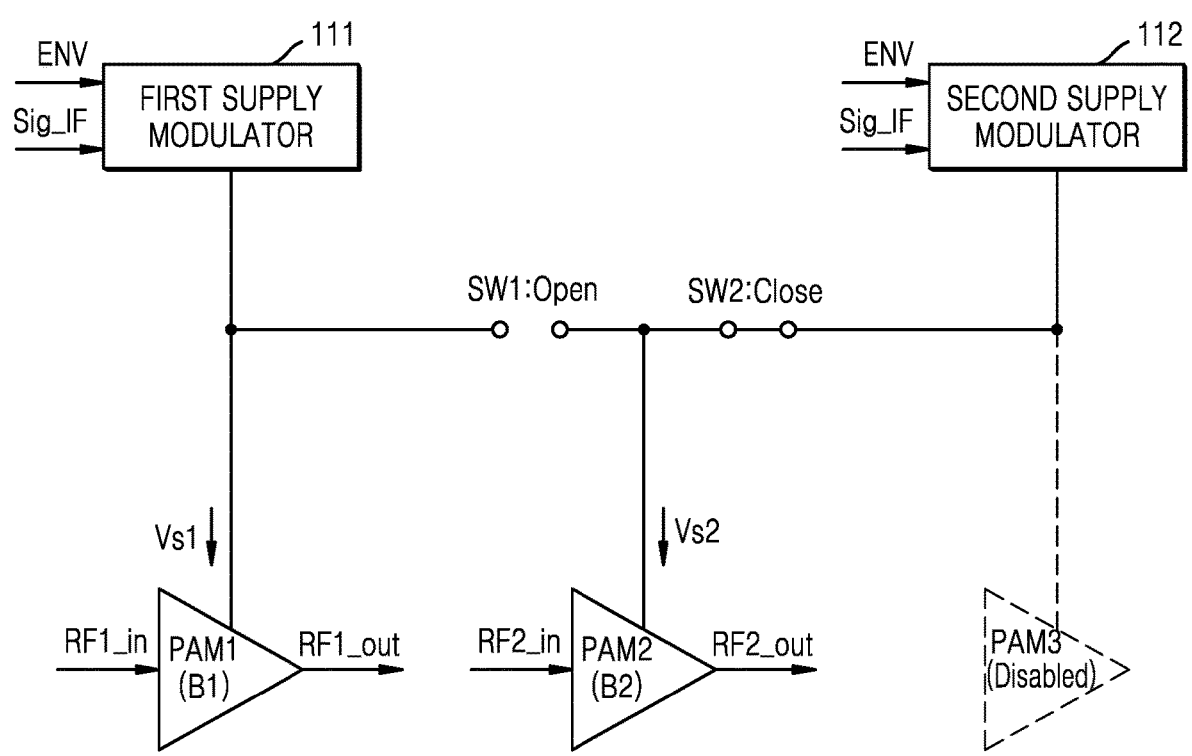

FIG. 4 is a timing diagram illustrating example operations of a switching signal and an enable signal, according to an embodiment, and FIGS. 5A through 5C are diagrams illustrating examples of the communication circuit 20 according to an embodiment.

Referring to FIGS. 3 and 4, a first mode Mode1 may indicate a mode for transmitting a signal by using the first operation frequency band B1 and the third operation frequency band B3. In the first mode Mode1, the first switching signal Sig_S1 and the second switching signal Sig_S2 may be logic low, and accordingly, the first switch SW1 and the second switch SW2 may be opened. In addition, the first enable signal Sig_EN1 and the third enable signal Sig_EN3 may be logic high, and accordingly, the first power amplifier PAM1 and the third power amplifier PAM3 may be activated. The second enable signal Sig_EN2 may be logic low, and accordingly, the second power amplifier PAM2 may be deactivated.

Referring to FIG. 5A, in the first mode Mode1, as both the first switch SW1 and the second switch SW2 are opened, the first supply voltage Vs1 provided by the first supply modulator 111 may be applied to the first power amplifier PAM1, and the second supply voltage Vs2 provided by the second supply modulator 112 may be applied to the third power amplifier PAM3. Accordingly, the first power amplifier PAM1 may generate the first RF output signal RF1_out by amplifying the first RF input signal RF1_in in the first operation frequency band B1, and the third power amplifier PAM3 may generate the third RF output signal RF3_out by amplifying the third RF input signal RF3_in in the third operation frequency band B3.

Referring again to FIGS. 3 and 4, a second mode Mode2 may indicate a mode for transmitting a signal by using the second operation frequency band B2 and the third operation frequency band B3. In the second mode Mode2, the first switching signal Sig_S1 may be logic high, and the second switching signal Sig_S2 may be logic low. Accordingly, the first switch SW1 may be shorted, and the second switch SW2 may be opened in addition, the first enable signal Sig_EN1 may be logic low, and the second enable signal Sig_EN2 and the third enable signal Sig_EN3 may be logic high. Accordingly, the first power amplifier PAM1 may be deactivated, and the second power amplifier PAM2 and the third power amplifier PAM3 may be activated.

Referring to FIG. 5B, in the second mode Mode2, as the first power amplifier PAM1 is deactivated and the first switch SW1 is shorted, the first supply voltage Vs1 provided by the first supply modulator 111 may be applied to the second power amplifier PAM2. In addition, as the second switch SW2 is opened, the second supply voltage Vs2 provided by the second supply modulator 112 may be applied to the third power amplifier PAM3. Accordingly, the second power amplifier PAM2 may generate the second RF output signal RF2_out by amplifying the second RF input signal RF2_in in the second operation frequency band B2, and the third power amplifier PAM3 may generate the third RF output signal RF1_out by amplifying the third RF input signal RF3_in in the third operation frequency band B3.

Referring again to FIGS. 3 and 4, a third mode Mode3 may indicate a mode for transmitting a signal by using the first operation frequency band B1 and the second operation frequency band B2. In the third mode Mode3, the first switching signal Sig_S1 may be logic high, and the second switching signal Sig_S2 may be logic low. Accordingly, the first switch SW1 may be opened, and the second switch SW2 may be shorted. In addition, the first enable signal Sig_EN1 and the second enable signal Sig_EN2 may be logic high, and the third enable signal Sig_EN3 may be logic low. Accordingly, the first power amplifier PAM1 and the second power amplifier PAM2 may be activated, and the third power amplifier PAM3 may be deactivated.

Referring to FIG. 5C, in the third mode Mode3, as the first switch SW1 is opened, the first supply voltage Vs1 provided by the first supply modulator 111 may be applied to the first power amplifier PAM1. In addition, as the third power amplifier PAM3 is deactivated and the second switch SW2 is shorted, the second supply voltage Vs2 provided by the second supply modulator 112 may be applied to the second power amplifier PAM2. Accordingly, the first power amplifier PAM1 may generate the first RF output signal RF1_out by amplifying the first RF input signal RF1_in in the first operation frequency band B1, and the second power amplifier PAM2 may generate the second RF output signal RF2_out by amplifying the second RF input signal RF2_in in the second operation frequency band B2.

Figure 6:
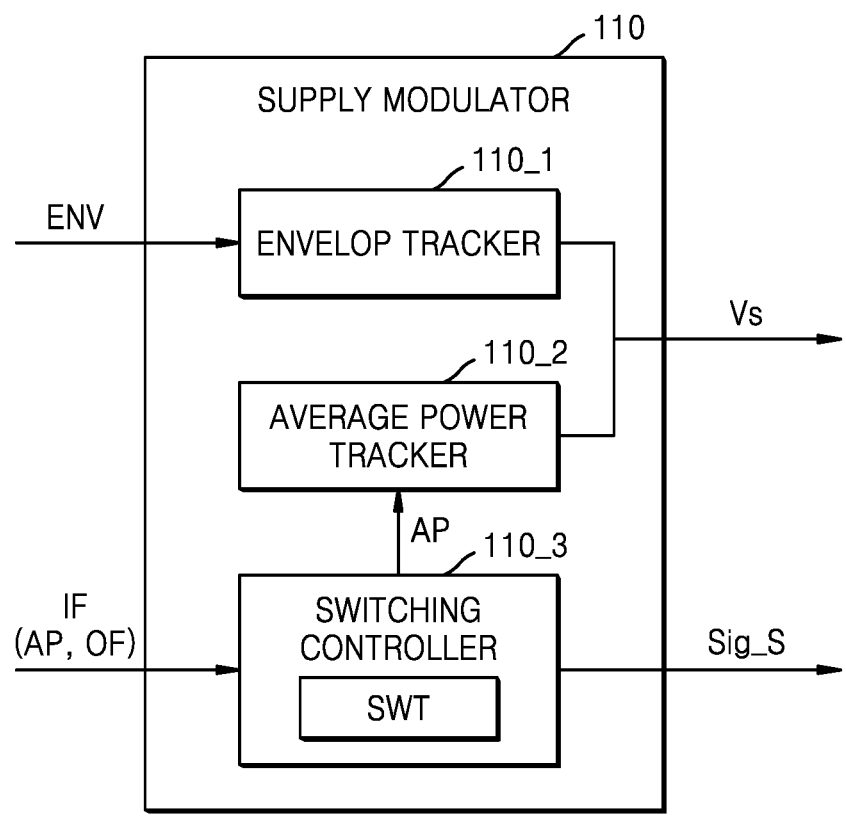
FIG. 6 is a block diagram illustrating a supply modulator according to an embodiment.

FIG. 6 is a block diagram illustrating an example of the supply modulator 110 according to an embodiment. The supply modulator 110 of FIG. 6 may represent the first supply modulator 111 or the second supply modulator 112 in FIG. 3.

Referring to FIG. 6, the supply modulator 110 may include an envelope tracker 110_1, an average power tracker 110_2, and a switching controller 110_3. The supply modulator 110 may provide a supply voltage according to envelope tracking (ET) or average power tracking (APT) to a power amplifier, for example, the first power amplifier PAM1 through the third power amplifier PAM3 in FIG. 3)

When the envelope tracking is applied, the supply voltage Vs may be generated by operating the envelope tracker 110_1. The envelope tracker 110_1 may receive the envelope signal ENV from a modem, for example, modem 200 in FIG. 2, and perform the envelope tracking based on the envelope signal ENV. The envelope tracker 110_1 may generate the supply voltage Vs based on a result of the envelope tracking. In an example, the envelope tracker 110_1 may include a linear regulator and a switching regulator and may generate the supply voltage Vs by summing outputs of the linear regulator and be switching regulator.

When the envelope tracking is applied, the supply voltage Vs may be generated by operating the average power tracker 110_2. The average power tracker 110_2 may receive the AP signal from the switching controller 110_3 and generate the supply voltage Vs based on the AP signal.

The switching controller 110_3 tray receive the interface signal IF and obtain the AP signal and the operation frequency signal OF from the interface signal IF. The switching controller 110_3 may output the AP signal to the AP tracker 110_2 and generate a switching signal Sig_S based on the operation frequency signal OF. The switching controller 110_3 may output the generated switching signal Sig_S to a switching circuit, for example switching circuit 120 in FIG. 3.

In an embodiment, the switching controller 110_3 may determine a center frequency required for signal transmission, based on the operation frequency signal OF, and generate the switching signal Sig_S corresponding thereto. In an embodiment, the switching controller 110_3 may include a switching table SWT and generate the switching signal Sig_S corresponding to a required center frequency based on the switching table SWT.

Figure 7A:
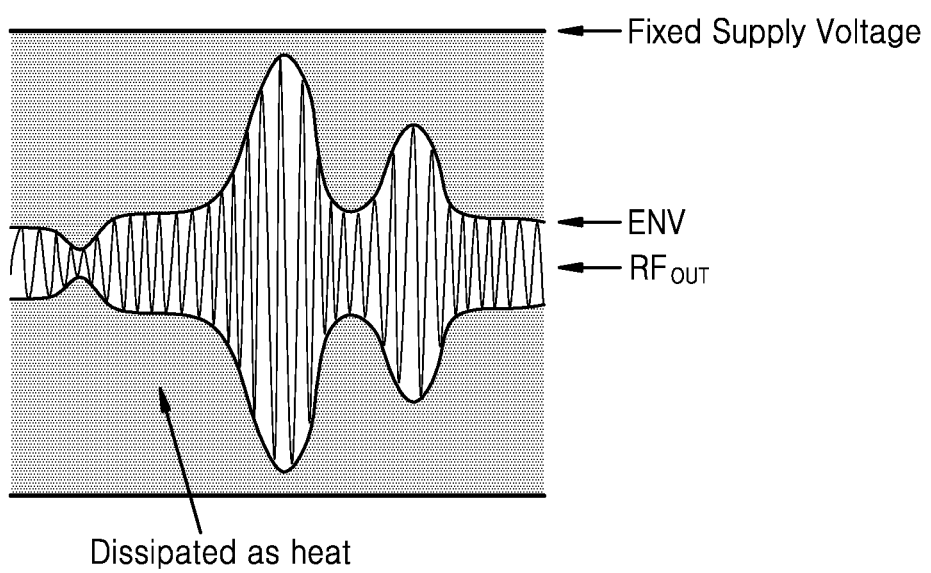
FIG. 7A illustrates a power supply and an output waveform of a power amplifier provided with a fixed power supply voltage according to an embodiment.
Figure 7B:
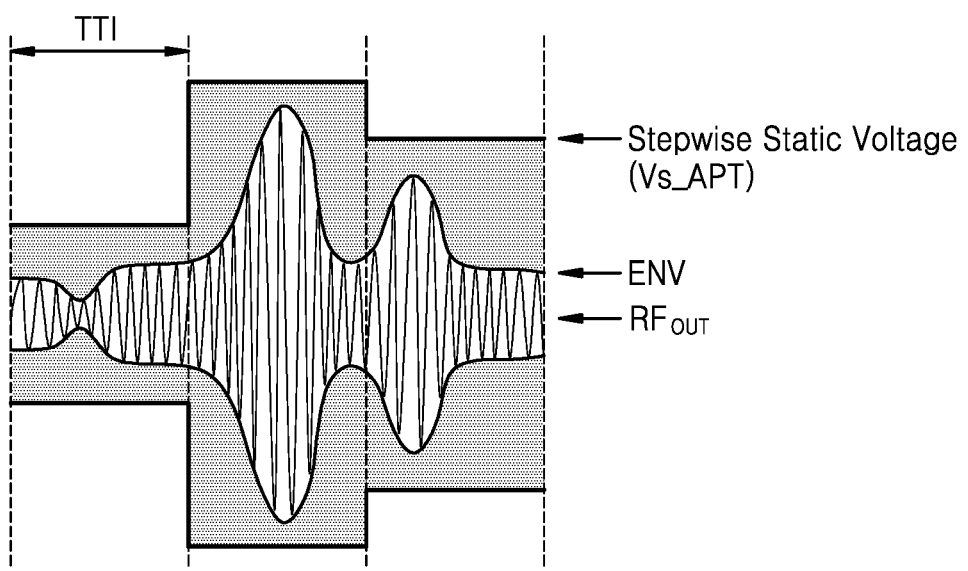
FIGS. 7B and 7C respectively illustrate a power supply and an output waveform of the power amplifier provided with a varying power supply voltage based on an envelope of a transmission signal provided by a supply modulator according to an embodiment.
Figure 7C:
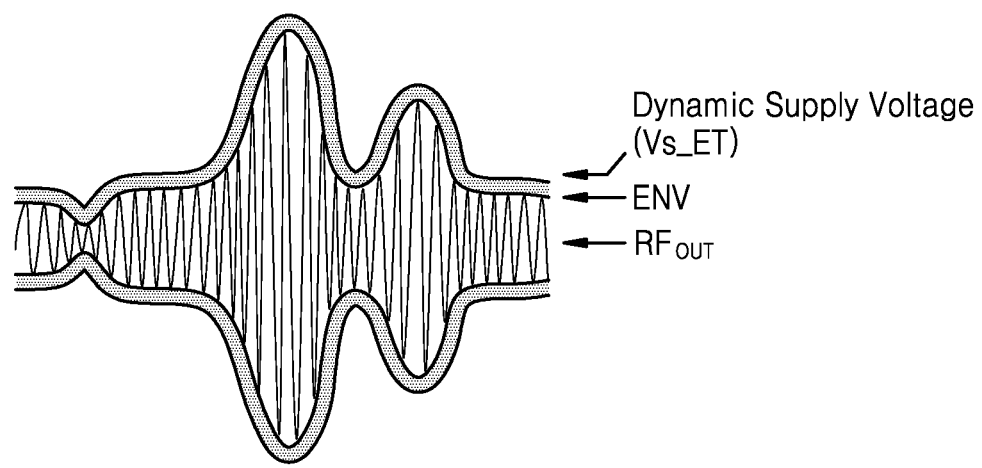

FIG. 7A illustrates a power supply and an output waveform of a power amplifier provided with a fixed power supply voltage according to a comparative example. FIGS. 7B and 7C respectively illustrate a power supply and an output waveform of the power amplifier provided with a varying power supply voltage based on an envelope of a transmission signal provided by a supply modulator according to an embodiment.

Referring to FIG. 7A, when the power amplifier operates by receiving a fixed power supply voltage, for example, a battery voltage as the power supply voltage, a voltage difference between an output signal $RF_{OUT}$ and the fixed power supply voltage may be relatively large. The voltage difference may reduce battery life and generate heat.

Referring to FIG. 7B, the average power tracking may be a technique of applying to the power amplifier a modulation voltage varying based on a peak level of the envelope at every constant transmission time interval (TTI). Referring to FIG. 7C, the envelope tracking may be a technique of instantaneously applying the modulation voltage to the power amplifier that follows a level of the envelope.

According to an embodiment, the supply modulating circuit may provide, to the power supply amplifier as the power supply voltage, a supply voltage Vs_APT which varies according to average power tracking as illustrated in FIG. 7B, or a supply voltage Vs_ET varying according to the envelope tracking as illustrated in FIG. 7C. Accordingly, by reducing the voltage difference between the output signal $RF_{OUT}$ of the power amplifier and the power supply voltage, energy waste may be reduced and the battery life may be increased.

The power efficiency of the power amplifier in the envelope tracking method may be higher than that in the average power tracking method, but the power efficiency of the supply modulating circuit in the average tracking method may be higher than that in the envelope tracking method. The power efficiency of the entire system, for example, the efficiency of the wireless communication device 10 of FIG. 2, may be proportional to a product of the efficiency of the supply modulating circuit and the efficiencies of the first through third power amplifiers PAM1 through PAM3. As a result, in a high power region where the output signal $RF_{OUT}$ is higher, the power efficiency of the entire system in the envelope tracking method may be higher than that in the average power tracking, and in a low power region where the output signal $RF_{OUT}$ is lower, the power efficiency of the entire system in the average power tracking method may be higher than that in the envelope tracking. Accordingly, the supply modulating circuit 100 in FIG. 2 may selectively generate a supply voltage according to one of the envelope tracking method and the average power tracking method according to the level of the envelope of the transmission signal.

Figure 8:
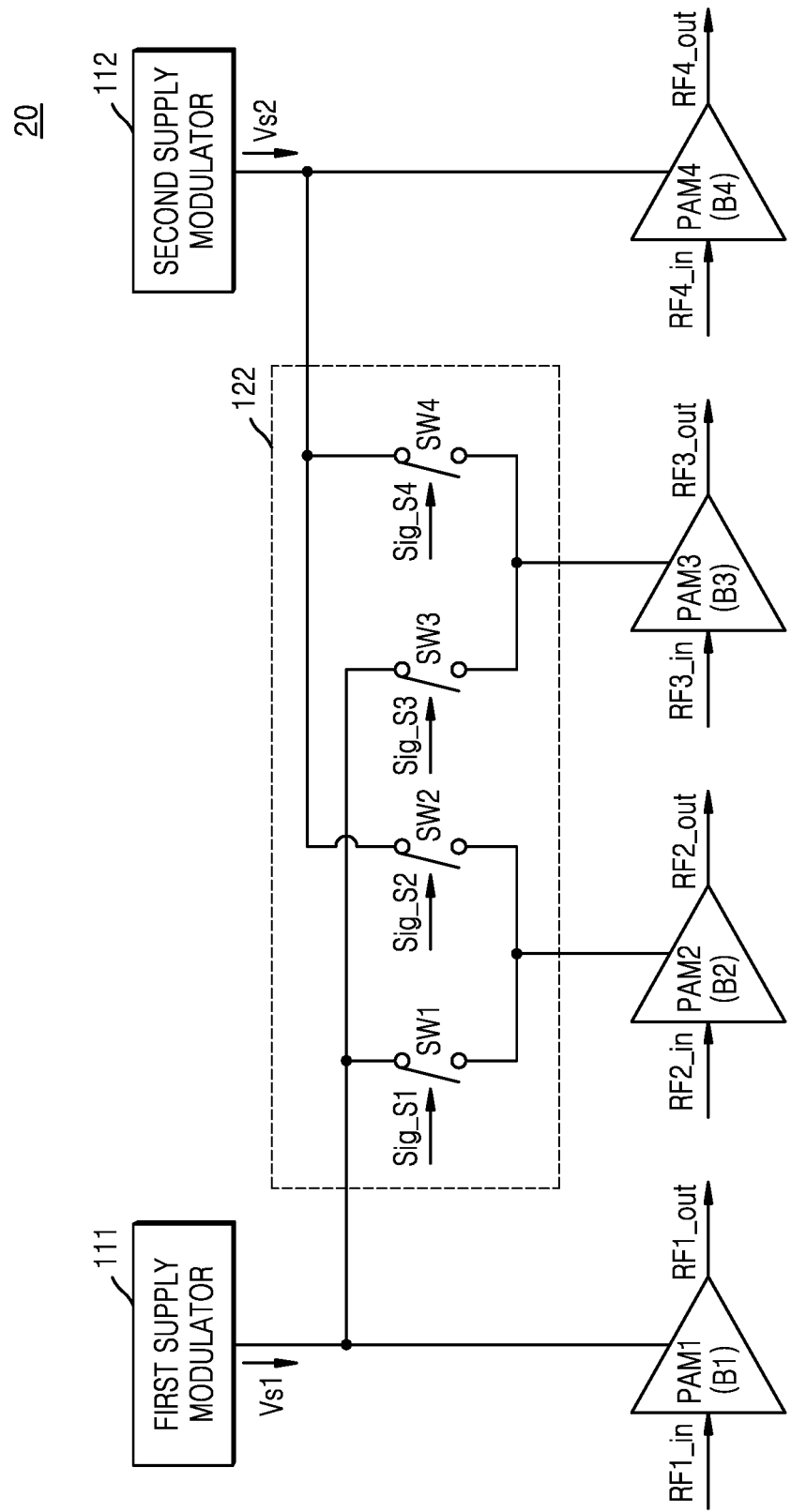
FIG. 8 is a circuit diagram illustrating a communication circuit according to an embodiment.

FIG. 8 is a circuit diagram illustrating an example of the communication circuit 20 according to an embodiment. FIG. 8 illustrates an embodiment in which supply power is selectively applied to two among four power amplifiers. Duplicate descriptions given with reference to FIG. 3 are omitted.

Referring to FIG. 8, the communication circuit 20 may include the first supply modulator 111, the second supply modulator 112, the switching circuit 122, and a plurality of power amplifiers PAM1 through PAM4.

The switching circuit 122 may include the first switch SW1 operating based on the first switching signal Sig_S1, the second switch S2 operating based on the second switching signal Sig_S2, a third switch SW3 operating based on a third switching signal Sig_S3, and a fourth switch SW4 operating based on a fourth switching signal Sig_S4.

The first switch SW1 may switch between the first supply modulator 111 and the second power amplifier PAM2 based on the first switching signal Sig_S1. In other words, the first switch SW1 may provide to the second power amplifier PAM2 the first supply voltage Vs1 provided from the first supply modulator 111 based on the first switching signal Sig_S1. The second switch SW2 may switch between the second supply modulator 112 and the second power amplifier PAM2 based on the second switching signal Sig_S2. In other words, the second switch SW2 may provide to the second power amplifier PAM2 the second supply voltage Vs2 provided from the second supply modulator 112 based on the second switching signal Sig_S2.

The third switch SW3 may switch between the first supply modulator 111 and the third power amplifier PAM3 based on the third switching signal Sig_S3. In other words, the third switch SW3 may provide to the third power amplifier PAM3 the first supply voltage Vs1 provided from the first supply modulator 111 based on the third switching signal Sig_S3. The fourth switch SW4 may switch between the second supply modulator 112 and the third power amplifier PAM3 based on the fourth switching signal Sig_S4. In other words, the fourth switch SW4 may provide to the third power amplifier PAM3 the second supply voltage Vs2 provided from the second supply modulator 112 based on the fourth switching signal Sig_S4.

As an example, when the fourth switch SW4 is shorted, the remaining switches SW1 through SW3 are opened, the first power amplifier PAM1 and the third power amplifier PAM3 are activated, and the second power amplifier PAM2 and the fourth power amplifier PAM4 are deactivated, the first power amplifier PAM1 may operate by the first supply modulator 111, and the third power amplifier PAM3 may be operated by the second supply modulator 112. Accordingly, the communication circuit 20 may transmit a signal by using the first operation frequency band B1 and the third operation frequency band B3.

According to an embodiment, a supply voltage may be selectively applied to at least two power amplifiers among the first through fourth power amplifiers PAM1 through PAM4 based on the operation of the switching circuit 122. The first through fourth power amplifiers PAM1 through PAM4 may receive transmission signals using different operation frequency bands, for example bands B1 through B4, and the communication circuit 20 may apply the supply voltage to a power amplifier corresponding to two operation frequency bands required for signal transmission by controlling tie switching circuit 122. Accordingly, since the communication circuit 20 according to an embodiment uses any two operation frequency bands among four operation frequency bands, a signal may be transmitted by using a total of six operation frequency band combinations, and many operation frequency band combinations may be provided by using a relatively small number of power amplifiers.

Figure 9:
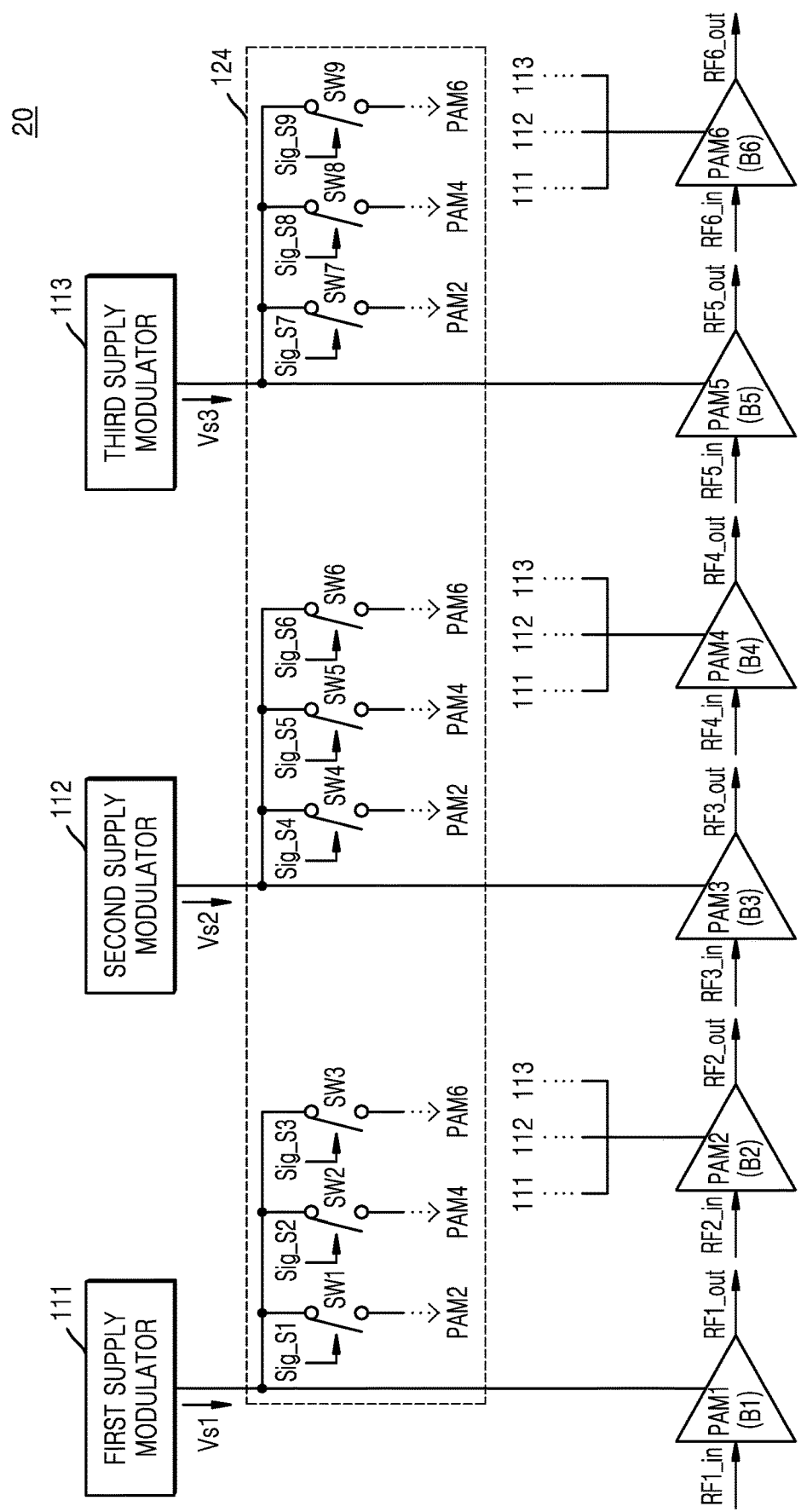
FIG. 9 is a circuit diagram illustrating a communication circuit according to an embodiment.

FIG. 9 is a circuit diagram illustrating an example of the communication circuit 20 according to an embodiment. FIG. 9 illustrates an embodiment in which supply power is selectively applied to three among six power amplifiers. Duplicate descriptions given with reference to FIG. 3 are omitted.

Referring to FIG. 8, the communication circuit 20 may include the first supply modulator 111, the second supply modulator 112, a third supply modulator 113, a switching circuit 124, and a plurality of power amplifiers PAM1 through PAM6.

The switching circuit 124 may include first through ninth switches SW1 to SW9. The first switch SW1 may provide to the second power amplifier PAM2 the first supply voltage Vs1 provided from the first supply modulator 111 based on the first switching signal Sig_S1. The second switch SW2 may provide to the fourth power amplifier PAM4 the first power voltage Vs1 provided from the first supply modulator 111 based on the second switching signal Sig_S2. The third switch SW3 may provide to the sixth power amplifier PAM6 the first supply voltage Vs1 provided from the first supply modulator 111 based on the third switching signal Sig_S3.

The fourth switch SW4 may provide to the second power amplifier PAM2 the second supply voltage Vs2 provided from the second supply modulator 112 based on the fourth switching signal Sig_S4. A fifth switch SW5 may provide to the fourth power amplifier PAM4 the second power supply voltage Vs2 provided from the second supply modulator 112 based on a fifth switching signal Sig_S5. A sixth switch SW6 may provide to the sixth power amplifier PAM6 the second supply voltage Vs2 provided from the second supply modulator 112 based on a sixth switching signal Sig_S6.

A seventh switch SW7 may provide to the second power amplifier PAM2 the third power voltage Vs3 provided from the third supply modulator 113 based on a seventh switching signal Sig_S7. An eighth switch SW8 may provide to the fourth power amplifier PAM4 the third power voltage Vs3 provided from the third supply modulator 113 based on an eighth switching signal Sig_S8. A ninth switch SW9 may provide to the sixth power amplifier PAM6 the third power voltage Vs3 provided from the third supply modulator 113 based on a ninth switching signal Sig_S9.

As an example, when the first switch SW1 and the eighth switch SW8 are shorted, the remaining switches SW2, SW3, SW4, SW5, SW6, SW7 and SW9, are opened, the second power amplifier PAM2, the third power amplifier PAM3, and the fourth power amplifier PAM4 are activated, and the remaining power amplifiers, PAM1, PAM5, and PAM6 are deactivated, the second power amplifier PAM2 may be operated by the first supply modulator 111, the third power amplifier PAM3 may be operated by the second supply modulator 112, and the fourth power amplifier PAM4 may be operated by the third supply modulator 113. Accordingly, the communication circuit 20 may transmit a signal by using the second operation frequency band B2, the third operation frequency band B3, and the fourth operation frequency band B4.

According to an embodiment, a supply voltage may be selectively applied to at least three power amplifiers among the first through ninth power amplifiers PAM1 through PAM9 based on the operation of the switching circuit 122.

The first through ninth power amplifiers PAM1 through PAM9 may receive transmission signals using different operation frequency bands, for example bands B1 through B9, and the communication circuit 20 may apply the supply voltage to a power amplifier corresponding to three operation frequency bands required for signal transmission by controlling the switching circuit 122. Accordingly, since the communication circuit 20 according to an embodiment uses any three operation frequency bands among six operation frequency bands, a signal may be transmitted by using a total of twenty operation frequency band combinations, and many operation frequency band combinations may be provided by using a relatively small number of power amplifiers.

Although FIGS. 8 and 9 illustrate examples of amplifying a signal by using two supply modulators and four power amplifiers or three supply modulators and six power amplifiers, respectively, the examples are only embodiments. It may be readily understood that the present disclosure includes embodiments in which various numbers of operation frequency band combinations are provided by connecting N supply modulators to M power amplifiers, where N and M are natural numbers, using switching circuits.

In addition, although in FIGS. 8 and 9, there are power amplifiers, for example PAM1 and PAM4 in FIG. 8, and PAM1, PAM3, and PAM5 in FIG. 9, which are directly connected to the supply modulator and the switching circuits, the embodiments are only examples. It may be understood that the present disclosure includes embodiments in which ail the power amplifiers are connected to the supply modulators via the switching circuits.

Figure 10A:
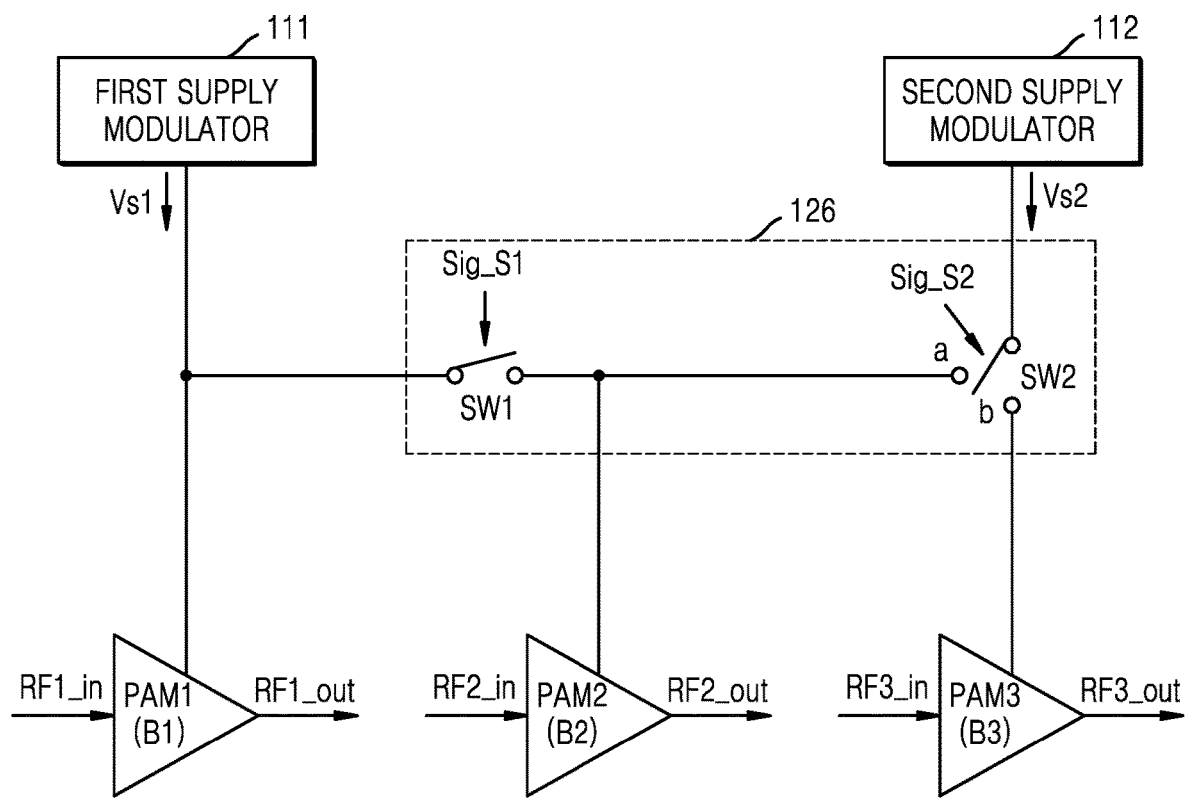
FIG. 10A is a circuit diagram illustrating a communication circuit according to an embodiment.

FIG. 10A is a circuit diagram illustrating an example of the communication circuit 20 according to an embodiment. FIG. 10A illustrates an example including switches that selectively connect some of the supply modulators to the power amplifiers. Duplicate descriptions given with reference to FIG. 3 are omitted.

Referring to FIG. 10A, the communication circuit 20 may include the first supply modulator 111, the second supply modulator 112, the switching circuit 126, and the first through third power amplifiers PAM1 through PAM3, and the switching circuit 126 may include the first switch SW1 and the second switch SW2.

The first switch SW1 may provide to the second power amplifier PAM2 the first supply voltage Vs1 provided from the first supply modulator 111 based on the first switching signal Sig_S1. The second switch SW2 may connect the second supply modulator 112 to the second power amplifier PAM2 or to the third power amplifier PAM3 based on the second switching signal Sig_S2. In other words, the second switch SW2 may provide to the second power amplifier PAM2 or the third power amplifier PAM3 the second supply voltage Vs2 provided from the second supply modulator 112 based on the second switching signal Sig_S2.

To this end, the second switch SW2 may include a switching element for selectively connecting a first node a that is connected to the second power amplifier PAM2 and the third power amplifier PAM3 based on the second switching signal Sig_S2 and a second node b that is connected to the third power amplifier PAM3 to the second supply modulator 112. In FIG. 10A, the second switch SW2 is represented by one switching element, but the embodiment is only an example, and the second switch SW2 may be implemented by one switching element or more.

Figure 10B:
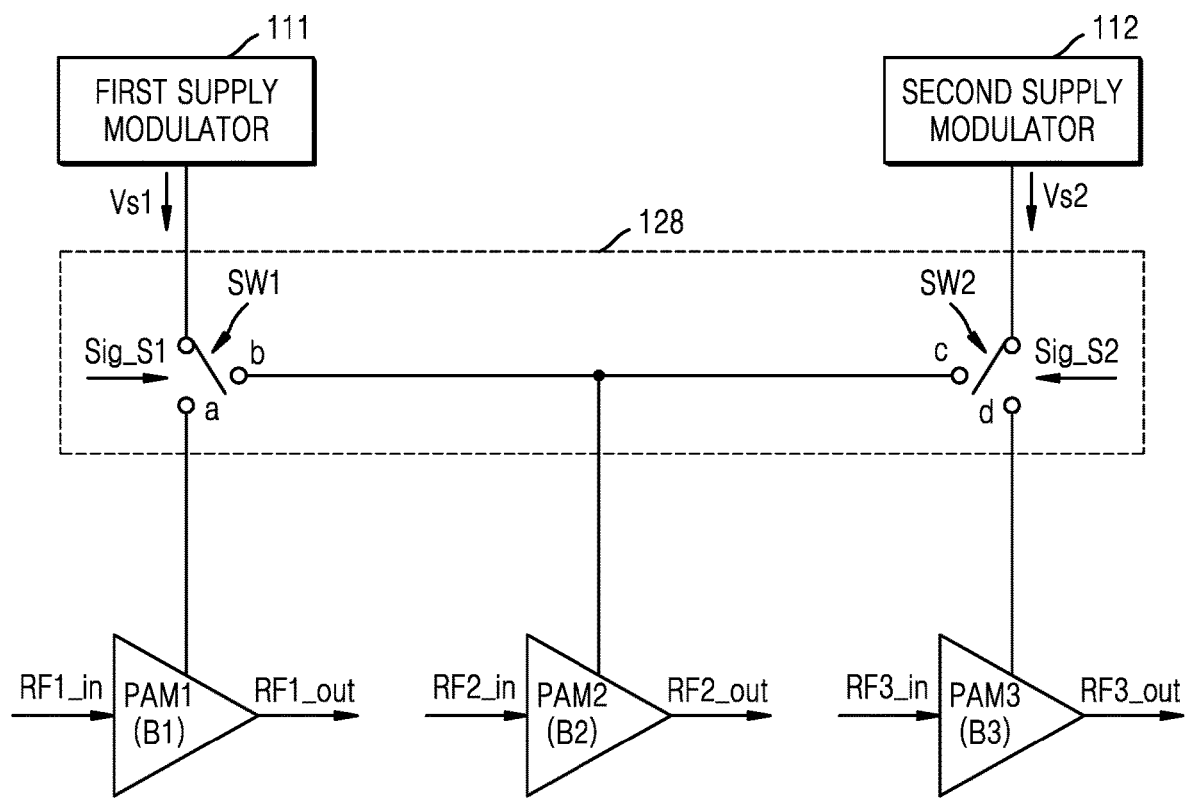
FIG. 10B is a circuit diagram illustrating a communication circuit according to an embodiment.

FIG. 10B is a circuit diagram illustrating an example of the communication circuit 20 according to an embodiment. FIG. 10b illustrates an example including switches that selectively connect the supply modulators to the power amplifiers. Duplicate descriptions given with reference to FIG. 10A are omitted.

Referring to FIG. 10B, the communication circuit 20 may include the first supply modulator 111, the second supply modulator 112, a switching circuit 128, and the first through third power amplifiers PAM1 through PAM3, and the switching circuit 128 may include the first switch SW1 and the second switch SW2.

The first switch SW1 may connect the first supply modulator 111 to the first power amplifier PAM1 or the second power amplifier PAM2 based on the first switching signal Sig_S1. In other words, the first switch SW1 may provide the first supply voltage Vs2 provided from the first supply modulator 111 to the first power amplifier PAM1 or the second power amplifier PAM2 based on the first switching signal Sig_S1.

To this end, the first switch SW1 may include a switching element that, based on the first switching signal Sig_S1, selectively connects the first node a connected to the first power amplifier PAM1, and the second node b connected to the second power amplifier PAM2, to the second supply modulator 112.

The second switch SW2 may connect the second supply modulator 112 to the second power amplifier PAM2 or to the third power amplifier PAM3 based on the second switching signal Sig_S2. In other words, the second switch SW2 may provide to the second power amplifier PAM2 or the third power amplifier PAM3 the second supply voltage Vs2 provided from the second supply modulator 112 based on the second switching signal Sig_S2.

To this end, the second switch SW2 may include a switching element for selectively connecting a third node c that is connected to the second power amplifier PAM2 based on the second switching signal Sig_S2 and a fourth node d that is connected to the third power amplifier PAM3 to the second supply modulator 112.

According to the embodiment of FIG. 10B, as the first switch SW1 selectively switches the first node a and the second node b, and the second switch SW2 selectively switches the first node a and the second node b, the first supply modulator 111 may apply the first supply voltage Vs1 to the first power amplifier PAM1 or the second power amplifier PAM2, and the second supply modulator 112 may apply the second supply voltage Vs2 to the second power amplifier PAM2 or the third power amplifier PAM3.

FIGS. 10A and 10B illustrate examples in which switching elements for example SW1 and SW2, switch between two nodes, but the embodiments are only examples, and it may be readily understood that the present disclosure includes embodiments in which the switching element selectively switches two nodes or more.

FIGS. 10A and 10B illustrate examples of amplifying a signal by using two supply modulators and three power amplifiers, but the embodiments are only examples. It may be readily understood that the present disclosure includes embodiments in which the switching elements selectively switch two nodes or more in the switching circuits 126 and 128, and also embodiments in which N supply modulators to M power amplifiers, where N and M are natural numbers, are connected to each other by using switching circuits.

Figure 11:
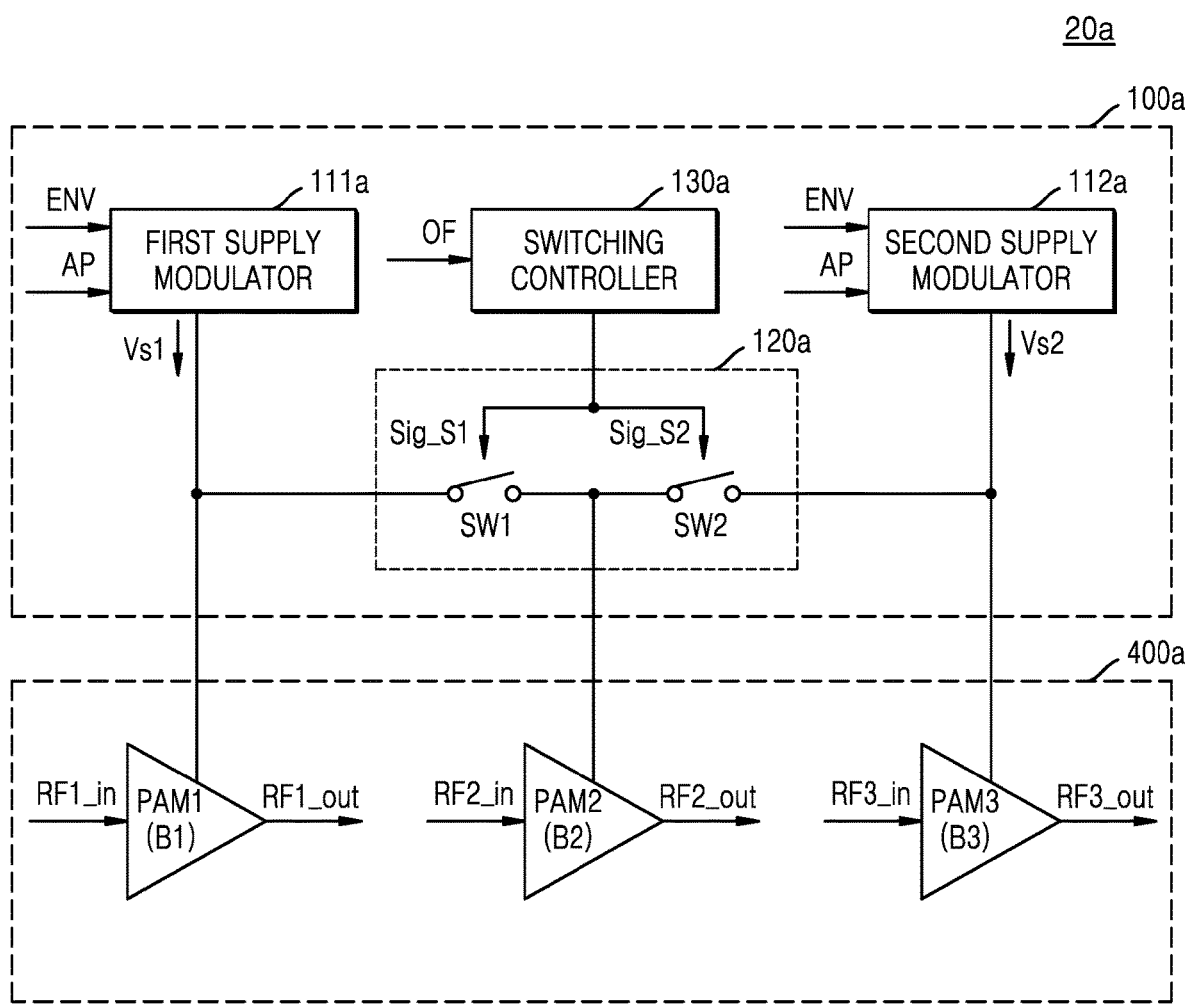
FIG. 11 is a circuit diagram illustrating a communication circuit according to an embodiment.

FIG. 11 is a circuit diagram illustrating an example of a communication circuit 20a according to an embodiment. FIG. 11 illustrates an embodiment in which a plurality of supply modulators 111a and 112a and a switching controller 130a, which is independent, are included in the communication circuit 20a. Duplicate descriptions given with reference to FIGS. 3 and 6 are omitted.

Referring to FIG. 11, the communication circuit 20a may include a supply modulating circuit 100a and a power amplifier circuit 400a. The supply modulating circuit 100 may include a first supply modulator 111a, a second supply modulator 112a, a switching circuit 120a, and a switching controller 130a.

The first supply modulator 111a may receive the envelope signal ENV and the AP signal and provide the first supply voltage Vs1 to the supply amplifying circuit 400a. The second supply modulator 112a may receive the envelope signal ENV and the AP signal and provide the second supply voltage Vs2 to the supply amplifying circuit 400a.

The switching controller 130a may receive the operation frequency signal OF and generate a switching signal Sig_S based on the operation frequency signal OF. The switching controller 130a may output the generated switch ng signal Sig_S to the switching circuit 120a.

In an embodiment, the switching controller 130a may determine the center frequency required for signal transmission, based on the operation frequency signal OF, and generate the switching signal Sig_S corresponding thereto.

Figure 12:
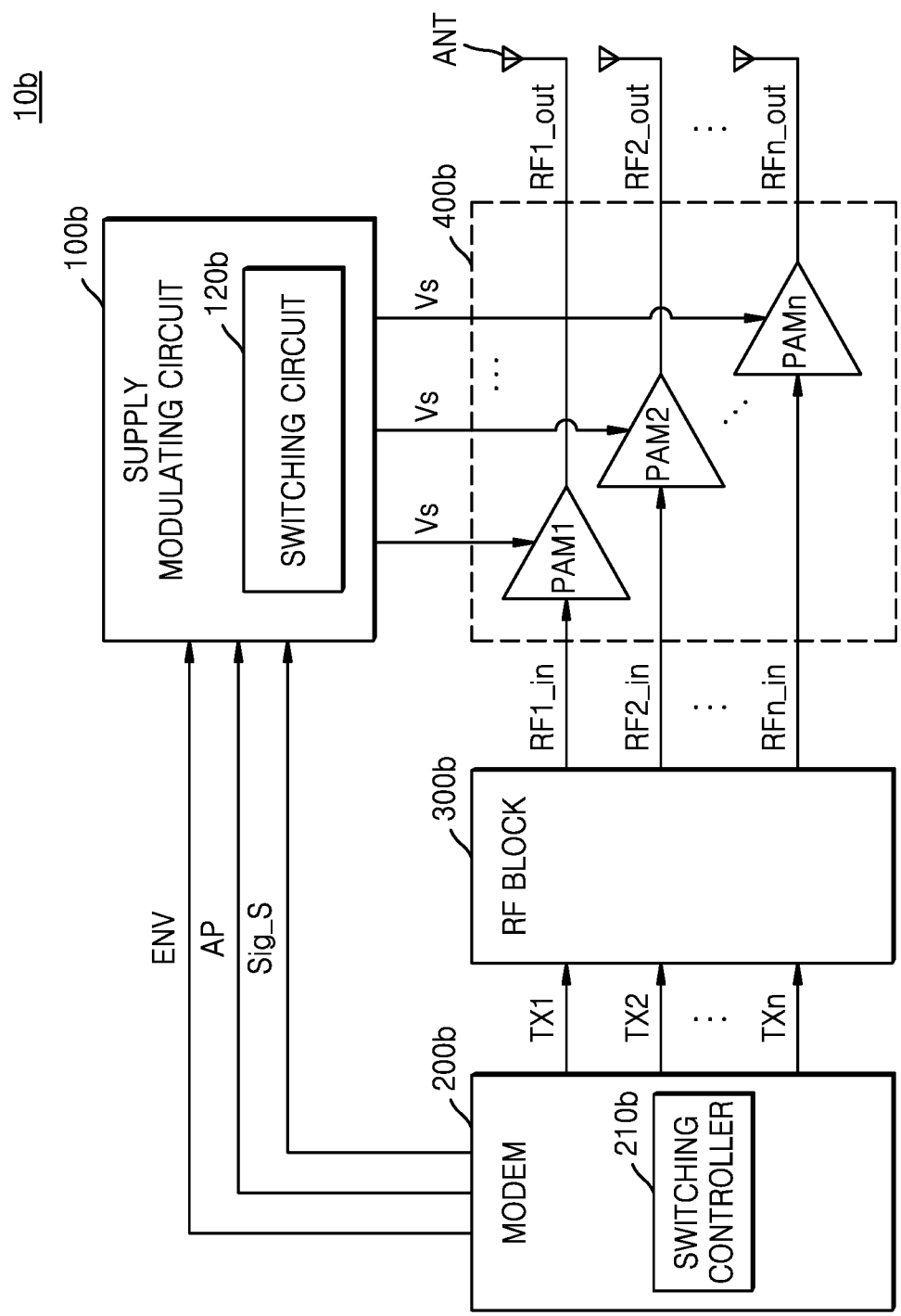
FIG. 12 is a block diagram illustrating a wireless communication device according to an embodiment.

FIG. 12 is a block diagram illustrating an example of a wireless communication device 10b according to an embodiment. FIG. 12 illustrates an embodiment in which a switching controller 210b is included in a modem 200b. Duplicate descriptions given with reference to FIGS. 2 and 6 are omitted.

Referring to FIG. 12, the wireless communication device 10b may include the modem 200b, a supply modulating circuit 100b, an RF block 300b, and a supply amplifying circuit 400b. The modem 200b may include the switching controller 210b, and the supply modulating circuit 100b may include a switching circuit 120b.

The switching controller 210b mcv determine an operation frequency band required for signal transmission and generate the switching signal Sig_S based on the operation frequency band. The switching controller 210b may output the generated switching signal Sig_S to the switching circuit 120b. The switching circuit 120b may selectively provide the supply voltage Vs generated by the supply modulating circuit 100b based on the switching signal Sig_S received from the switching controller 210b to at least some of first through $n^{th}$ power amplifiers PAM1 through PAMn.

According to an embodiment, the modem 200b may determine a power amplifier to operate according to an operation frequency band and output the switching signal Sig_S to the switching circuit 120b based on the determined power amplifier.

Figure 13:
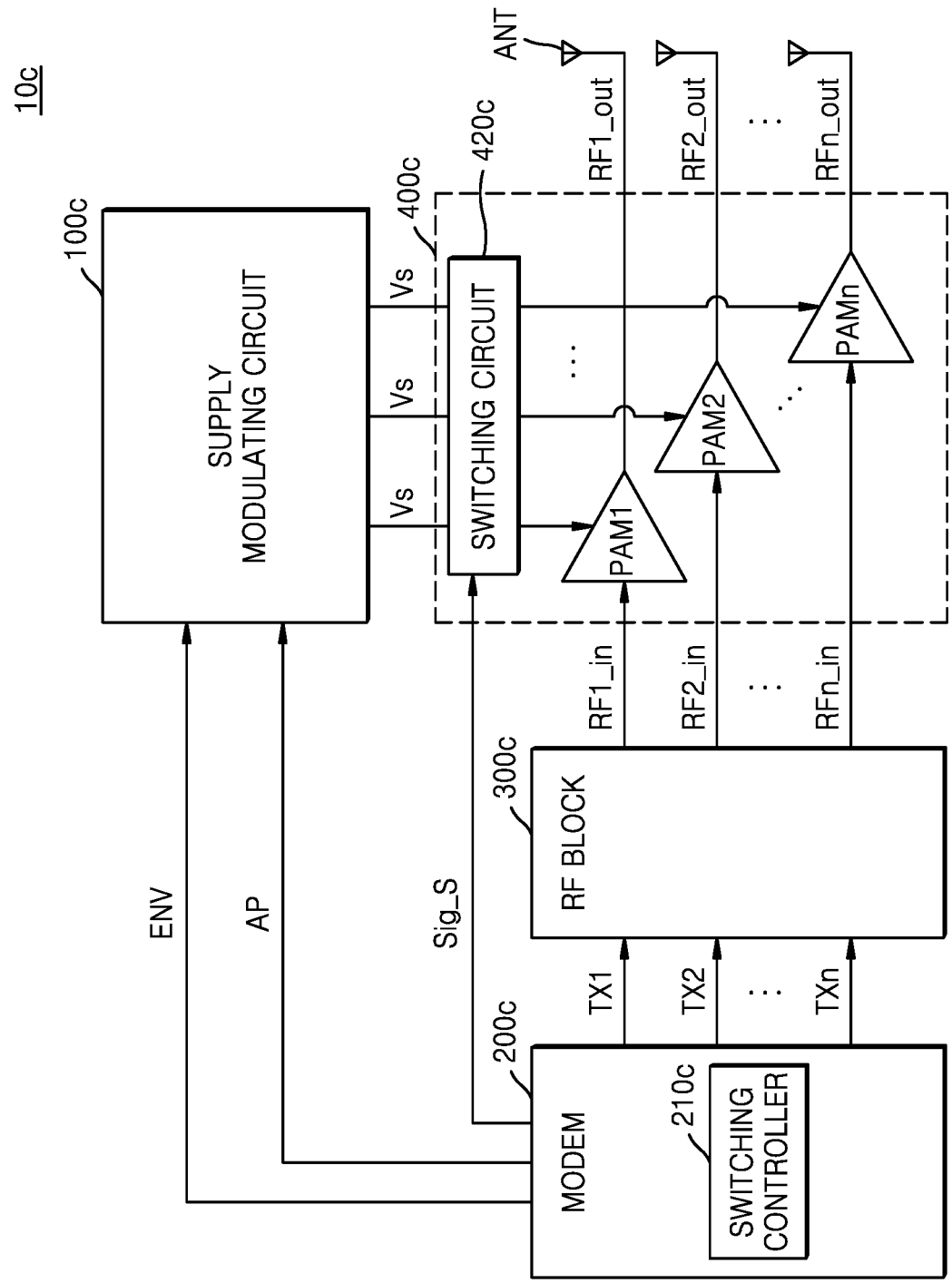
FIG. 13 is a block diagram illustrating a wireless communication device according to an embodiment.

FIG. 13 is a block diagram illustrating an example of a wireless communication device 10c according to an embodiment. FIG. 13 illustrates an embodiment in which a switching circuit 420c is included in a supply amplifying circuit 400c. Duplicate descriptions given with reference to FIGS. 2 and 12 are omitted.

Referring to FIG. 13, the wireless communication device 10c may include a modem 200c, a supply modulating circuit 100c, in RF block 300c, and the supply amplifying circuit 400c. The modem 200c may include a switching controller 210c, and the supply amplifying circuit 400c may include the switching circuit 420c.

The switching controller 210c may output the switching signal Sig_S generated based on the operation frequency band to the switching circuit 420c included in the supply amplifying circuit 400c. The switching circuit 420c may selectively supply the supply voltage Vs provided from the supply modulating circuit 100c to at least some of the first through n$^{th}$ power amplifiers PAM1 through PAMn based on the switching signal Sig_S that is received.

According to an embodiment, the switching circuit 420c may be included in the supply amplifying circuit 400c, and the supply amplifying circuit 400c may determine a supply amplifier to operate directly based on the switching signal Sig_S.

Figure 14:
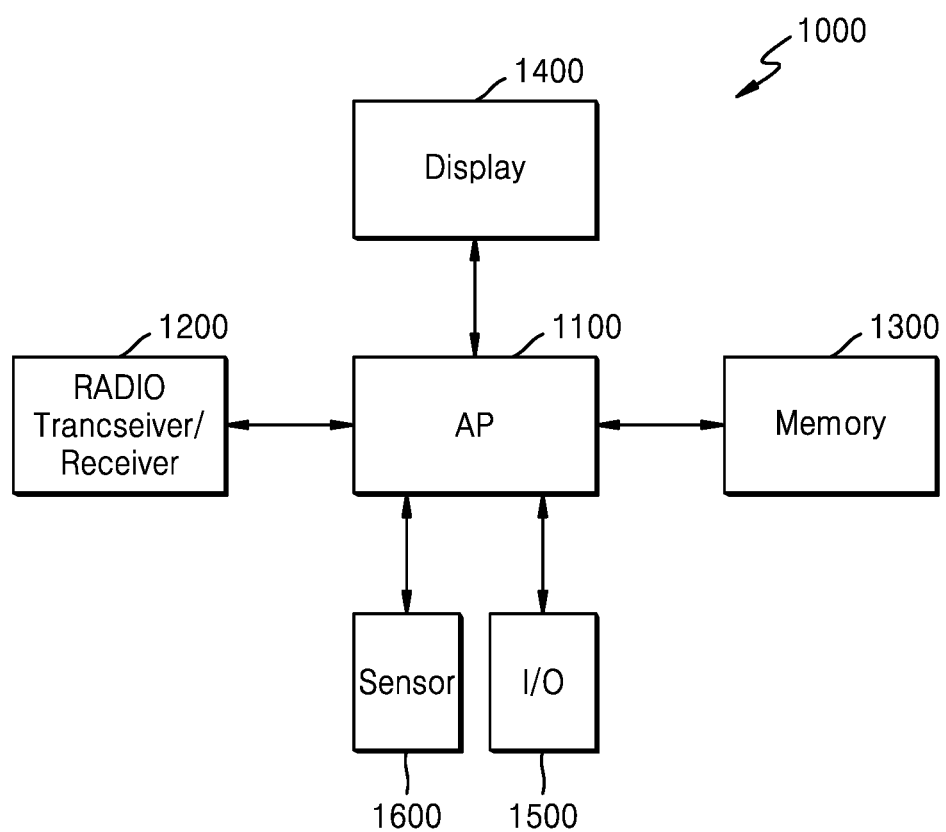
FIG. 14 is a block diagram illustrating an internet of things (IoT) device according to an embodiment.

FIG. 14 is a block diagram illustrating an example of an Internet of Things (IoT) device 1000, according to an embodiment.

Referring to FIG. 14, a communication circuit according to embodiments of the present disclosure may be included in the IoT device 1000. The term IoT may mean a network between things using wired/wireless communication. The IoT device 1000 may include an accessible wired or wireless interface, and may include devices that communicate with at least one other device via a wired or wireless interface to transmit or receive data. The accessible wired or wireless interface may include a wired local area network (LAN), a wireless local area network (WLAN) such as Wi-Fi, a wireless personal area network (WPAN) such as Bluetooth, or a wireless universal serial bus (USB), Zigbee, near field communication (NFC), radio frequency identification (RFID), power line communication (PLC), or a modem communication interface that may be connected to a mobile cellular network such as 3G, 4G, and long-term evolution (LTE). The Bluetooth interface may support Bluetooth low energy (BLE).

The IoT device 1000 may include a communication interface 1200 for communicating with the outside. For example, the communication interlace 1200 may be a radio transceiver/receiver. The communication interface 1200 may include, for example, a modem communication interface connectable to a w ireless local area communication interface such as LAN, Bluetooth, Wi-fi, and Zigbee, PLC, and a mobile communication network such as 3G and LTE. The communication interface 1200 may include a transmitter and/or a receiver. The IoT device 1000 may transmit and/or receive information from an access point or a gateway via the transmitter and/or the receiver. In addition, the IoT device 1000 may transmit and/or receive control information or data thereof by communicating with a user device or other IoT devices.

In the present embodiment, the transmitter included in the communication interface 1200 may transmit a transmission signal via a plurality of frequency bands by using carrier aggregation (CA) technology. To this end, the transmitter may include a plurality of power amplifiers for power amplification of a plurality of RF input signals respectively corresponding to a plurality of carriers, and a supply modulating circuit for providing a power supply voltage to the plurality of power amplifiers. The supply modulating circuit may be implemented according to the embodiments described above with reference to FIGS. 1 through 13. The supply modulating circuit may include a switching circuit for selectively providing supply power provided from a supply modulator to the plurality of power amplifiers.

The IoT device 1000 may further include a processor or an application processor 1100 that performs operations. The IoT device 1000 may further include a built-in battery for internal power supply or a power supply unit that receives power from the outside. In addition, the IoT device 1000 may include a display 1400 for displaying an internal state or data. The user may control the IoT device 1000 via a user interface (UI) of the display 1400 of the IoT device 1000. The IoT device 1000 may transmit an internal state and/or data to the outside via the transmitter, and receive a control command and/or data from the outside via the receiver.

A memory 1300 may store a control command code for controlling the IoT device 1000, control data, or user data. The memory 1300 may include at least one of a volatile memory and a non-volatile memory. The nonvolatile memory may include at least one of read-only memory (ROM), programmable ROM (PROM), electrically programmable ROM (EPROM), electrically erasable PROM (EEPROM), a flash memory, phase-change random-access memory (RAM) (PRAM), magnetic RAM (MRAM), resistive RAM (ReRAM), ferroelectric RAM (FRAM), and etc. The volatile memory may include at least one of various memories such as dynamic RAM (DRAM), static RAM (SRAM), synchronous DRAM (SDRAM), etc.

The IoT device 1000 may further include a storage device. The storage device may include a non-volatile medium such as a hard disk (HDD), a solid state disk (SSD), an embedded multi-media card (eMMC) and a universal flash storage (UFS). The storage device may store user information provided via an input/output unit 1500 and sensing information collected by using a sensor 1600.

Figure 15:
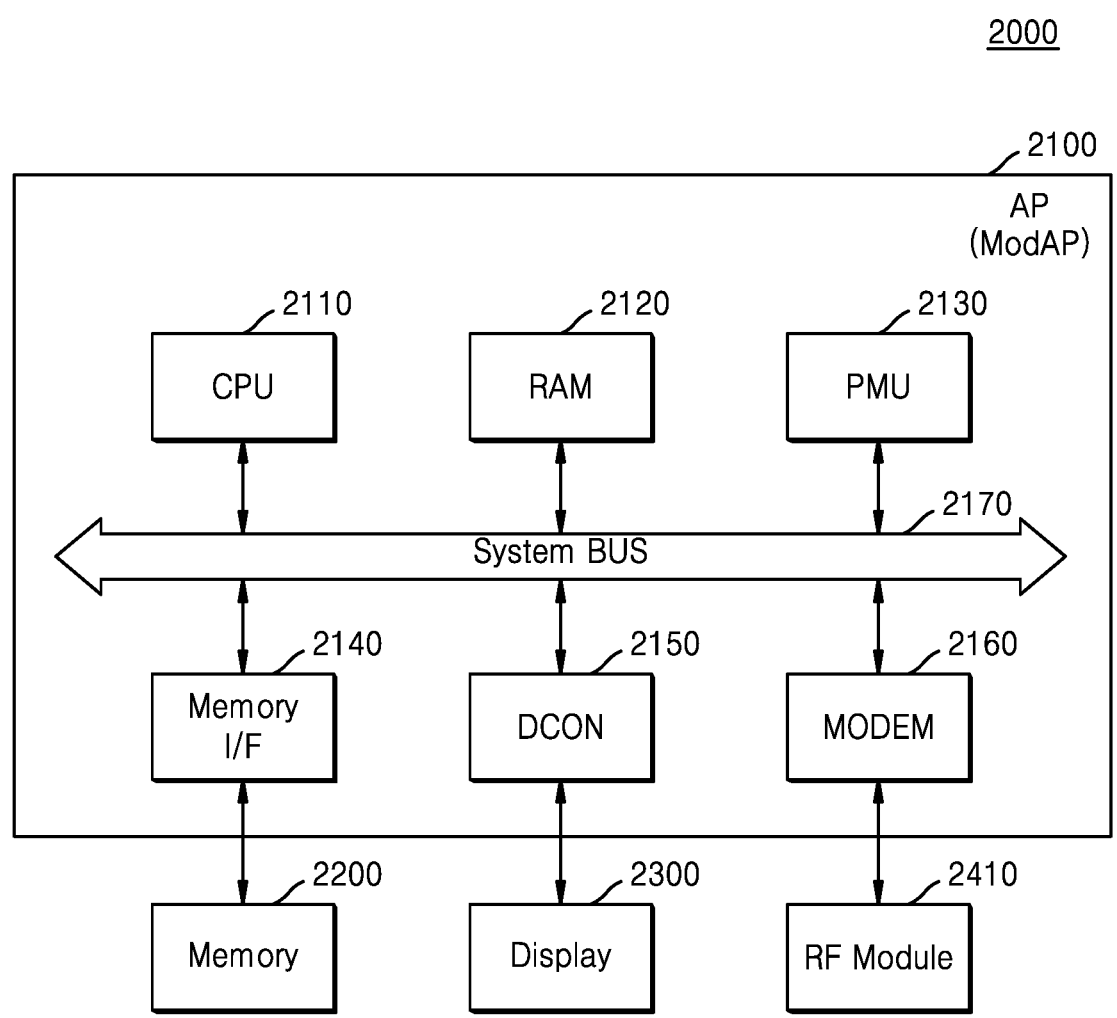
FIG. 15 is a mobile terminal according to an embodiment.

FIG. 15 is a mobile terminal 2000 according to an embodiment.

Referring to FIG. 15, the mobile terminal 2000 may include an application processor 2100 AP, a memory 2200, a display 2300, and an RF module 2410. In addition, the mobile terminal 2000 may further include various components such as a lens, a sensor, and an audio module.

The application processor 2100 may be implemented as a system on chip (SoC), and may include a central processing unit (CPU) 2110, a RAM 2120, a power management unit (PMU) 2130, a memory interface 2140, a display controller 2150, a modem 2160, and a bus 2170.

The application processor 2100 may further include various IPs. The application processor 2100 may be referred to as a ModAP, is functions of a modem chip are integrated therein.

The CPU 2110 may control overall operations of the application processor 2100 and the mobile terminal 2000. The CPU 2110 may control the operation of each element of the application processor 2100. In an embodiment, the CPU 2110 may be implemented as a multi-core. The multi-core may include a computing component including two or more independent cores.

RAM 2120 may temporarily store programs, data, or instructions. For example, the programs and/or data stored in the memory 2200 may be temporarily stored in the RAM 2120 according to the control or booting codes of the CPU 2110. The RAM 2120 may be implemented with DRAM or SRAM.

The PMU 2130 may manage power of each component of the application processor 2100. The PMU 2130 may also determine an operation status of each component of the application processor 2100 and control an operation thereof.

The memory interface 2140 may control an overall operation of a memory 2200, and may control data exchange between each component of the application processor 2100 and the memory 2200. The memory interface 2140 may write data to the memory 2200 or read data from the memory 2200 at a request of the CPU 2110.

The display controller 2150 may transmit image data to be displayed on the display 2300 to the display 2300. The display 2300 may be implemented as a flat panel display or a flexible display such as a liquid crystal display (LCD) and an organic light emitting diode (OLED).

The modem 2160 may, for wireless communication, modulate the data to be transmitted to suit a wireless environment, and recover data that has been received. The modem 2160 may perform digital communication with the RF module 2410.

The RF module 2410 may convert a high frequency signal received via an antenna into a low frequency signal, and transmit the convened low frequency signal to the modem 2160. In addition, the RF module 2410 may convert the low frequency signal received from the modem 2160 into a high frequency signal, and transmit the converted high frequency signal to the outside of the mobile terminal 2000 via an antenna. In addition, the RF module 2410 may amplify or filter signals.

In the present embodiment, the RF module 2410 may transmit a transmission signal via a plurality of frequency bands by using the CA technology. To this end, the RF module 2410 may include a plurality of power amplifiers for power amplification of a plurality of RF input signals respectively corresponding to a plurality of carriers, and a supply modulator for providing a power supply voltage to the plurality of power amplifiers. The supply modulator may be implemented according to the embodiments described above with reference to FIGS. 1 through 13. The supply modulating circuit may include a switching circuit for selectively providing supply power provided from a supply modulator to the plurality of power amplifiers.

While embodiments have been particularly shown and described, it will be understood that various changes in form and details may be made therein without departing from the spirit and scope of the following claims.

What is claimed is:

1. A communication circuit comprising:
   a first supply modulator configured to provide a first supply voltage;
   a first power amplifier configured to generate a first output signal by amplifying a first input signal corresponding to a first operation frequency band;
   a second power amplifier configured to generate a second output signal by amplifying a second input signal corresponding to a second operation frequency band; and
   a switching circuit configured to selectively provide the first supply voltage from the first supply modulator to the second power amplifier based on a first switching signal according to an operation mode,
   wherein the first supply modulator is configured to adjust a voltage level of the first supply voltage according to one of an envelope tracking method and an average power tracking method, and
   wherein the first power amplifier is further configured to receive the first supply voltage from the first supply modulator without the first supply voltage passing through the switching circuit.

2. The communication circuit of claim 1, further comprising a second supply modulator configured to provide a second supply voltage,
   wherein the switching circuit is further configured to provide the second supply voltage to the second power amplifier based on a second switching signal, and the second power amplifier is configured to amplify the second input signal using the second supply voltage.

3. The communication circuit of claim 2, wherein the switching circuit comprises:
   a first switch configured to switch between the first supply modulator and the second power amplifier based on the first switching signal; and
   a second switch configured to switch between the second supply modulator and the second power amplifier based on the second switching signal.

4. The communication circuit of claim 3, further comprising a third power amplifier configured to generate a third output signal by amplifying a third input signal using one of the first supply voltage or the second supply voltage,
   wherein the switching circuit is further configured to provide the first supply voltage from the first supply modulator to the third power amplifier based on a third switching signal, and to provide the second supply voltage from the second supply modulator to the third power amplifier based on a fourth switching signal.

5. The communication circuit of claim 4, wherein the first power amplifier, the second power amplifier, and the third power amplifier are further configured to amplify input signals corresponding to different operation frequency bands.

6. The communication circuit of claim 5, further comprising a fourth power amplifier configured to generate a fourth output signal by amplifying a fourth input signal using the second supply voltage,
   wherein the fourth power amplifier is further configured to receive the second supply voltage from the second supply modulator without the second supply voltage passing through the switching circuit, and
   wherein the fourth power amplifier is deactivated based on the second supply modulator providing the second supply voltage to the second power amplifier using the switching circuit.

7. The communication circuit of claim 5, wherein the switching circuit further comprises:
   a third switch configured to switch between the first supply modulator and the third power amplifier based on the third switching signal;
   a fourth switch configured to switch between the second supply modulator and the third power amplifier based on the fourth switching signal.

8. The communication circuit of claim 2, further comprising:
   a third supply modulator configured to provide a third supply voltage;
   a fifth power amplifier configured to generate a fifth output signal by amplifying a fifth input signal using one of the first supply voltage, the second supply voltage, and the third supply voltage; and
   a sixth power amplifier configured to generate a sixth output signal by amplifying a sixth input signal using another one of the first supply voltage, the second supply voltage, and the third supply voltage,
   wherein the switching circuit is further configured to provide a supply voltage to power amplifiers that are connected by connecting each of the first through third supply modulators to a respective one of the first through sixth power amplifiers.

9. The communication circuit of claim 1, further comprising a switching controller configured to:
   receive operation frequency band information corresponding to the first output signal or the second output signal, and
   output at least one switching signal to the switching circuit based on the operation frequency band information.

10. The communication circuit of claim 1, wherein the first supply modulator comprises:

an envelope tracker configured to receive an envelope signal and to adjust the voltage level of the first supply voltage based on the envelope signal; and an average power tracker configured to receive an input signal and to adjust the voltage level of the first supply voltage based on interval average power of the input signal, wherein the first supply modulator is further configured to adjust the voltage level of the first supply voltage using one of the envelope tracker and the average power tracker.

11. A communication circuit comprising:
a plurality of supply modulators providing a plurality of supply voltages;
a plurality of power amplifiers configured to generate a plurality of output signals by amplifying a plurality of input signals based on the plurality of supply voltages; and
a plurality of switching components configured to provide the plurality of supply voltages to one or more of the plurality of power amplifiers based on operation frequency bands of the plurality of output signals,
wherein the plurality of switching components are configured to provide the plurality of supply voltages to power amplifiers that are connected by connecting each of the plurality of supply modulators to a respective one of the plurality of power amplifiers,
wherein the plurality of supply modulators are configured to adjust voltage levels of the plurality of supply voltages according to one of an envelope tracking method and an average power tracking method, and
wherein a power amplifier of the plurality of power amplifiers is configured to receive a supply voltage from a supply modulator of the plurality of supply modulators without the supply voltage passing through the plurality of switching components.

12. The communication circuit of claim 11, wherein the plurality of input signals correspond to different operation frequency bands.

13. The communication circuit of claim 11, further comprising a switching controller configured to receive operation frequency information for transmitting the plurality of output signals, and to output at least one switching signal to the plurality of switching components based on the operation frequency information.

14. The communication circuit of claim 11, wherein each of the plurality of supply modulators is configured to adjust a voltage level of the plurality of supply voltages according to the one of the envelope tracking method and the average power tracking method.

15. A wireless communication device comprising:
a modem configured to generate a transmission signal;
a supply modulating circuit configured to provide one of a first supply voltage or a second supply voltage; and
a supply amplifying circuit configured to generate an output signal by amplifying an input signal generated based on the transmission signal using the one of the first supply voltage or the second supply voltage,
wherein the supply modulating circuit comprises at least one switching component configured to provide the one of the first supply voltage or the second supply voltage to the supply amplifying circuit based on an operation frequency and
wherein the supply modulating circuit is configured to adjust one of a first voltage level of the first supply voltage or a second voltage level of the second supply voltage according to one of an envelope tracking method and an average power tracking method before providing the one of the first supply voltage or the second supply voltage to the at least one switching component,
wherein the supply modulating circuit comprises a first supply modulator configured to provide the first supply voltage,
wherein the supply amplifying circuit comprises a first power amplifier configured to generate a first output signal by amplifying a first input signal using the first supply voltage, and
wherein the first power amplifier is further configured to receive the first supply voltage from the first supply modulator without the first supply voltage passing through the at least one switching component.

16. The wireless communication device of claim 15, wherein the supply modulating circuit comprises a plurality of supply modulators, and the supply amplifying circuit comprises a plurality of power amplifiers, and
wherein the at least one switching component is configured to provide the one of the first supply voltage or the second supply voltage to power amplifiers that are connected by connecting each of the plurality of supply modulators to a respective one of the plurality of power amplifiers.

17. The wireless communication device of claim 15, wherein the supply modulating circuit further comprises
a second supply modulator configured to provide the second supply voltage, and
wherein the supply amplifying circuit further comprises:
a second power amplifier configured to generate a second output signal by amplifying a second input signal using the first supply voltage or the second supply voltage; and
a third power amplifier configured to generate a third output signal by amplifying a third input signal using the second supply voltage.

18. The wireless communication device of claim 17, wherein the at least one switching component comprises:
a first switch configured to switch between the first supply modulator and the second power amplifier based on a first switching signal; and
a second switch configured to switch between the second supply modulator and the second power amplifier based on a second switching signal.

19. The wireless communication device of claim 17, wherein the supply modulating circuit further comprises a third supply modulator providing a third supply voltage,
wherein the supply amplifying circuit further comprises:
a fifth power amplifier configured to generate a fifth output signal by amplifying a fifth input signal using one of the first supply voltage, the second supply voltage, and the third supply voltage; and
a sixth power amplifier configured to generate a sixth output signal by amplifying a sixth input signal using another one of the first supply voltage, the second supply voltage, and the third supply voltage, and
wherein the at least one switching component is further configured to provide a supply voltage to power amplifiers that are connected by connecting each of the first through third supply modulators to a respective one of the first through sixth power amplifiers.

* * * * *